(12) United States Patent
Azakami et al.

(10) Patent No.: US 8,697,314 B2
(45) Date of Patent: Apr. 15, 2014

(54) METHOD OF PRODUCING VOLUME HOLOGRAM LAMINATE

(75) Inventors: Minoru Azakami, Tokyo-to (JP); Koji Eto, Tokyo-to (JP); Hiroyuki Ohtaki, Tokyo-to (JP); Yoshihito Maeno, Tokyo-to (JP); Sakurako Hatori, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 531 days.

(21) Appl. No.: 12/528,840

(22) PCT Filed: Feb. 28, 2008

(86) PCT No.: PCT/JP2008/053560
§ 371 (c)(1), (2), (4) Date: Aug. 27, 2009

(87) PCT Pub. No.: WO2008/105510
PCT Pub. Date: Sep. 4, 2008

(65) Prior Publication Data
US 2010/0104952 A1    Apr. 29, 2010

(30) Foreign Application Priority Data

Feb. 28, 2007 (JP) ................................ 2007-049783
Sep. 26, 2007 (JP) ................................ 2007-248694
Oct. 1, 2007 (JP) ................................ 2007-257348

(51) Int. Cl.
*G03H 1/02* (2006.01)
*G03H 1/18* (2006.01)

(52) U.S. Cl.
CPC ........... *G03H 1/02* (2013.01); *G03H 2001/186* (2013.01); *G03H 2250/44* (2013.01); *G03H 2260/12* (2013.01)

USPC .................. 430/1; 430/2; 430/330; 430/328; 430/331; 359/3

(58) Field of Classification Search
None
See application file for complete search history.

(56) References Cited

U.S. PATENT DOCUMENTS 4,816,360 A * 3/1989 Doyle et al. ...................... 430/2
4,959,283 A * 9/1990 Smothers et al. ................. 430/1
(Continued)

FOREIGN PATENT DOCUMENTS

JP     63-284586 A    11/1988
JP     03-046687 A    2/1991
(Continued)

OTHER PUBLICATIONS

Machine translation of JP 09-022242.*
(Continued)

*Primary Examiner* — Martin Agebranndt
(74) *Attorney, Agent, or Firm* — Ladas & Parry LLP

(57) ABSTRACT

A method of producing a volume hologram laminate which can regenerate a hologram image in an arbitrary wavelength by a simple process. The method uses a volume hologram forming substrate which includes: a substrate, a volume hologram layer formed on the substrate and containing a photopolymerizable material, a resin layer, formed on the substrate so as to contact to the volume hologram layer, containing a resin and a polymerizable compound. The producing method includes processes of: a hologram recording process to record a volume hologram to the volume hologram layer, a substance transit process of transiting the polymerizable compound to the volume hologram layer, and an after-treatment process of polymerizing the polymerizable compound.

4 Claims, 11 Drawing Sheets

(56) References Cited

U.S. PATENT DOCUMENTS

| | | | |
|---|---|---|---|
| 5,024,909 A * | 6/1991 | Smothers et al. | 430/1 |
| 5,182,180 A * | 1/1993 | Gambogi et al. | 430/1 |
| 5,702,846 A * | 12/1997 | Sato et al. | 430/2 |
| 5,725,970 A * | 3/1998 | Martin et al. | 430/2 |
| 5,843,598 A * | 12/1998 | Ueda et al. | 430/2 |
| 5,856,048 A * | 1/1999 | Tahara et al. | 430/1 |
| 6,756,157 B2 * | 6/2004 | Ohtaki et al. | 430/1 |
| 2001/0053004 A1 * | 12/2001 | Nishikawa et al. | 359/15 |
| 2004/0023122 A1 * | 2/2004 | Felder et al. | 430/2 |

FOREIGN PATENT DOCUMENTS

| | | |
|---|---|---|
| JP | 06-332356 A | 12/1994 |
| JP | 09-022242 A | 1/1997 |
| JP | 09-090857 A | 4/1997 |
| JP | 11-064636 A | 3/1999 |
| JP | 11-272153 A | 10/1999 |
| JP | 2000-276034 A | 10/2000 |
| JP | 2002-358018 A | 12/2002 |

OTHER PUBLICATIONS

Kawabata et al. "Photopolymer system and its application to a color hologram" Appl. Opt., vol. 33(11) pp. 2152-2156 (Apr. 1994).*
Stevenson et al., "Advances in photopolymer films for display holography", Proc. SPIE 2333 pp. 60-70 (1995).*
Tipton et al., "Improved process of reflection holography replication and heat processing", Proc. SPIE 2176 pp. 172-183 (1994).*
International Search Report PCT/JP2008/053560.

* cited by examiner

FIG. 1A
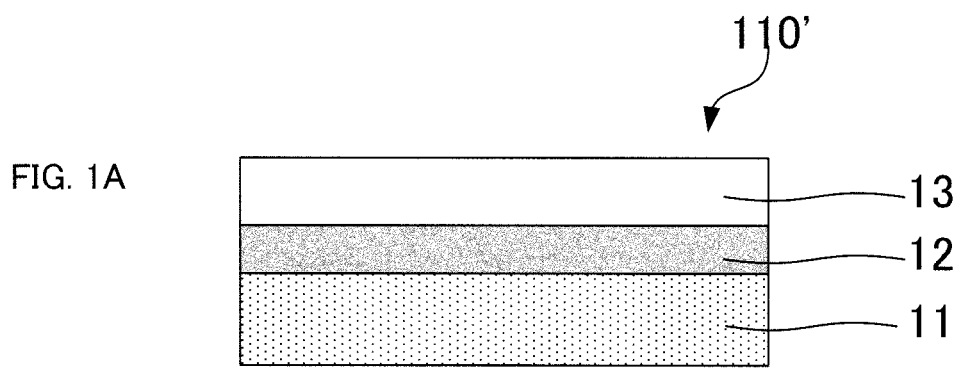
FIG. 1B
FIG. 1C
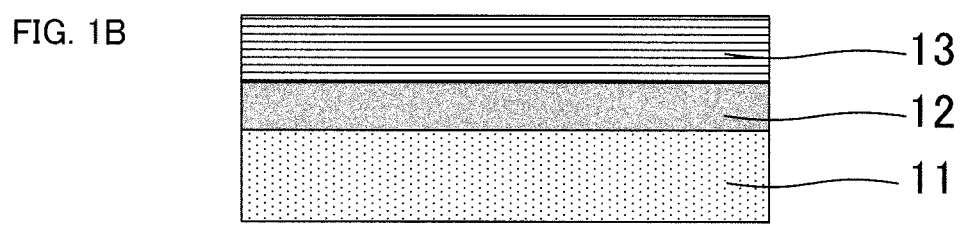
FIG. 1D
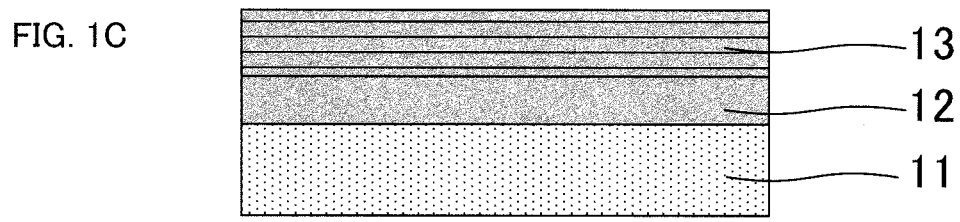
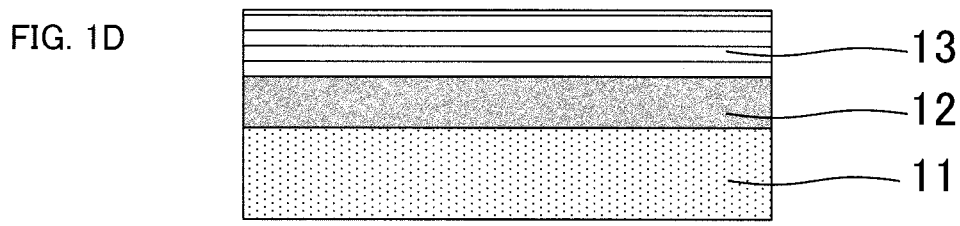
FIG. 1E
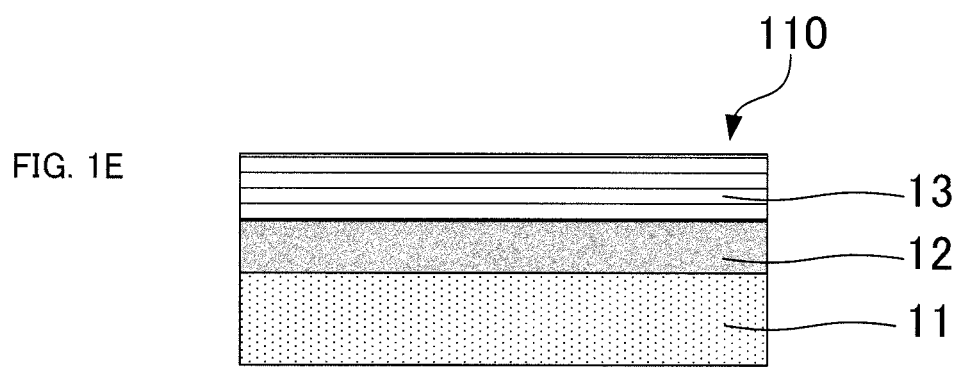

METHOD OF PRODUCING VOLUME HOLOGRAM LAMINATE

TECHNICAL FIELD

The present invention relates to a method of producing a volume hologram laminate which comprises a volume hologram layer with a volume hologram recorded. The present invention relates to a volume hologram laminate which comprises a volume hologram layer with a volume hologram recorded, a volume hologram transfer foil using the volume hologram laminate, and a volume hologram label. Further, the present invention relates to a volume hologram laminate excellent in forgery prevention (recycling prevention) and in design, and a method of producing the same.

BACKGROUND ART

Holograms are those in which the wave front of an object light beam is recorded as interference fringes in a photosensitive material by the interference between two beams (object light beam and reference light beam) having the same wavelength. When a light beam having the same conditions as a reference light beam used at the time of recording interference fringes is applied, a diffraction phenomenon by the interference fringes is caused, and whereby the same wave front as that of the original object light beam can be regenerated. Such a hologram can be divided into some types (surface relief type hologram and a volume type hologram) by the recording faun of interference fringes.

Here, the surface relief type hologram is a type in which fine convexo-concave pattern is engraved on the surface of a hologram layer to record a hologram. The volume type hologram, on the other hand, is a type in which interference fringes produced by the interference of light are depicted three-dimensionally in the direction of the thickness as fringes differing in refractive index to record a hologram.

The volume type hologram can be mass-produced by using the hologram original master, and therefore has an advantage of being better in technical production compare to the relief type hologram. However, reality is that the laser beam used for technical production is limited in their wavelengths. Therefore, the wavelengths of the light which regenerate the hologram image of the volume type hologram mass-produced are also limited and it has been difficult to regenerate bright hologram images in embodiments commonly using the holograms.

To respond to such problem, methods of changing the regenerated wavelengths of the hologram images to the wavelengths different from the wavelengths of lights used at the time of recording the interference fringes are recently used. In such method, an after-treatment to the volume hologram layer where the interference fringes are recorded is carried out, and thereby the period of interference fringes initially recorded is changed.

In other words, since the regenerated wavelengths of the volume hologram are the same to the period of interference fringes recorded on the hologram layer, by changing the period of interference fringes recorded to the hologram layer afterwards, it is possible to change the period of interference fringes identical to the wavelengths of lights which are frequently used in daily bases. Such methods to change the period of interference fringes recorded to the hologram layer afterwards is useful in that it is possible to produce the volume hologram layers which can regenerate bright hologram images in common embodiments.

As such methods to change the period of interference fringes recorded to the hologram layer afterwards, various methods are known. As a more common method, a method disclosed in the Patent Document 1 is introduced here as an example. The Patent Document 1 discloses a method to enlarge the period of interference fringe by moving a monomer and/or a plasticizer contained in a layer to a volume hologram layer by carrying out a treatment such as a heating treatment through contacting the layer containing the monomer and/or the plasticizer to the volume hologram layer where the interference fringes are recorded. Such a method is certainly effective in enlarging the period of interference fringes and to shift the regenerated wavelength to the long-wavelength side. However, on the other hand, it has problems such as offering few variable amounts in the period of interference fringe or making the process complicating.

Further, since the volume holograms can record information to the thickness direction, is means to record/regenerate the three-dimension images, and is expressed by light interference colors, it has an appearance not easily obtained by other image-forming means. The producing methods of the volume hologram are known, but copying of the volume hologram is difficult because producing thereof requires a sophisticated work using optical devices. Using such characteristics of the volume holograms, the volume holograms are used for prevention of copying the identification cards, bank card and others. The present inventors have been discussing various methods as shown in Patent Documents 2 and 3 to prevent forgery by making the peeling of volume hologram layer from the adhered identification card impossible so that peeling of which results in the breakage of the attached volume hologram. However, there is a possibility of allowing a copy of the volume hologram when a contact copy by a single wavelength laser using the volume hologram laminate with a volume hologram recorded as an original master is tried. Thus, a development of a volume hologram laminate which makes a copy of the volume hologram difficult has been called for.

Patent Document 1: Japanese Patent Application Laid-Open (JP-A) No. 3-46687
Patent Document 2: JP-A No. 63-284586
Patent Document 3: JP-A No. 2002-358018

DISCLOSURE OF INVENTION

Problem to be Solved by the Invention

The present invention has been achieved in view of the above-mentioned problems. The present invention provides: a method of producing a volume hologram laminate which produces in a simple process a volume hologram laminate that can be reproduced in an arbitrary wavelength, a volume hologram laminate which can be produced in a simple process and which can regenerate a bright hologram image by controlling the regenerated wavelength, and a volume hologram laminate the volume hologram of which is not easily copied even when a contact copy by a single wavelength laser is tried and a method of producing same.

Means for Solving the Problems

To resolve the above-mentioned problems, the present invention provides a method of producing a volume hologram laminate using a volume hologram forming substrate which comprises: a substrate, a volume hologram layer formed on the substrate and containing a photopolymerizable material, a resin layer, formed on the substrate so as to contact to the volume hologram layer, containing a resin and a polymerizable compound, characterized in that the producing method comprises processes of: a hologram recording process to record a volume hologram to the volume hologram layer, a substance transit process of transiting the polymerizable compound to the volume hologram layer, and an after-treatment process of polymerizing the polymerizable compound.

In the present invention, by using a substrate, wherein the resin layer and the volume hologram layer are laminated so as they contact each other, as the volume hologram forming substrate, by recording the volume hologram to the volume hologram layer in the hologram recording process, and then by transiting the polymerizable compound from the resin layer to the volume hologram layer in the above-mentioned substance transit process, it becomes possible to change the period of interference fringes recorded to the hologram layer afterwards.

Accordingly, in the present invention, a volume hologram laminate which can be reproduced in an arbitrary wavelength can be produced by a simple process.

In the present invention, the polymerizable compound is preferably transited from the volume hologram layer. As the polymerizable compound being transited from the volume hologram layer, for example, it is possible to produce the volume hologram forming substrate of the present invention, after a resin layer made of only the above-mentioned resin is formed on the volume hologram layer by transiting a polymerizable compound contained in the volume hologram layer. Thus, it becomes possible to carry out the method of producing a volume hologram laminate of the present invention by a simpler method. Further, as the polymerizable compound is transited from the volume hologram layer, there may be cases where it becomes easier to transit the polymerizable compound to the volume hologram layer in the substance transit process.

In the present invention, the photopolymerizable material preferably contains a radically polymerizable compound and a cationic polymerizable compound, and the polymerizable compound is preferably the cationic polymerizable compound. Thereby, the volume hologram laminate produced by the present invention can be made to a laminate which can regenerate a hologram image with high contrast.

Further, by making the polymerizable material contained in the resin layer and the constituent of the photopolymerizable material contained in the volume hologram layer identical, a volume hologram laminate can be produced by even a simpler process in the present invention.

To resolve the above-mentioned problems, the present invention further provides a volume hologram laminate comprising: a substrate, a volume hologram layer formed on the substrate and containing a photopolymerizable compound, in which a volume hologram is recorded by forming an interference fringe, and a volume hologram-laminated part formed so as to contact to the volume hologram layer and comprising a resin layer which contains a transparent resin, characterized in that an interference fringe is formed on the resin layer.

According to the present invention, because the interference fringe is also formed on the resin layer, by arbitrary controlling the respective periods of interference fringes formed on the volume hologram layer and the resin layer, it is possible to obtain a volume hologram laminate which can regenerate the bright hologram image at an arbitrary wavelength. Further, because the resin layer is formed so as to contact to the volume hologram layer in the present invention, the volume hologram laminate of the present invention can be produced by, for example, a method of simultaneously recording the interference fringes to the resin layer and the volume hologram layer after the volume hologram layer is directly formed on the resin layer. Thus, according to the present invention, a volume hologram laminate which can be produced in a simple process can be obtained. Therefore, in the present invention, it is possible to provide a volume hologram laminate which can be produced in a simple process and which can regenerate a bright hologram image by controlling the regenerated wavelength.

In the present invention, a period of the interference fringe formed on the volume hologram layer and a period of the interference fringe formed on the resin layer are preferably different. Because the hologram image can be regenerated at a wavelength which coincides with one of the periods of interference fringe formed on the resin layer and the volume hologram layer, it thereby becomes possible to regenerate the hologram image at plural regenerated wavelengths so that the volume hologram laminate of the present invention can be made to the laminate which can regenerate brighter hologram image.

Further in the present invention, a transmittance in visible light range of the volume hologram laminate has preferably at least 2 minimal transparent wavelengths. Thereby, the volume hologram laminate of the present invention can be made to a volume hologram laminate which can reproduce a further bright hologram image.

The present invention provides a volume hologram transfer foil comprising: the above-mentioned volume hologram laminate and a heat seal layer formed on the volume hologram-laminated part of the volume hologram laminate and comprising a thermoplastic resin.

According to the present invention, because the volume hologram laminate explained above is used, by arbitrary controlling the respective periods of interference fringes formed on the volume hologram layer and the resin layer of the volume hologram laminate, it is possible to obtain a volume hologram transfer foil which can regenerate the bright hologram image at an arbitrary wavelength.

In the volume hologram transfer foil of the present invention, a releasing layer is preferably formed between the volume hologram-laminated part and the substrate of the volume hologram laminate. By forming the releasing layer, adhesion between the substrate and the volume hologram-laminated part can be adjusted. As a result, peelability of the volume hologram-laminated part at the time of transferring the volume hologram-laminated part from the volume hologram transfer foil of the present invention can be improved.

The present invention provides a volume hologram label comprising: the above-mentioned volume hologram laminate, and a binding layer formed on the volume hologram-laminated part of the volume hologram laminate.

According to the present invention, because the volume hologram laminate explained above is used, by arbitrary controlling the respective periods of interference fringes formed on the volume hologram layer and the resin layer of the volume hologram laminate, it is possible to obtain a volume hologram label to which the volume hologram that can regenerate the bright hologram image at an arbitrary wavelength can be stuck.

Further, the volume hologram laminate of the present invention comprises: a resin layer partially provided on a substrate, and a volume hologram layer laminated on the substrate and formed so as to adjacent to the resin layer, characterized in that a volume hologram is formed on the resin layer, and characterized in that a part of the volume hologram laminate provided with the resin layer and a part of the volume hologram laminate provided with no resin layer have different regenerated-center wavelengths.

The volume hologram laminate of the present invention is characterized in that the resin layer and the substrate are adjacent to each other, and that a primer layer is formed between the resin layer and the substrate.

The volume hologram laminate of the present invention is characterized in that the volume hologram layer is a volume hologram layer comprising a volume hologram recording material which contains a radically polymerizable monomer and a cationic polymerizable monomer, and characterized in that the volume hologram is formed on the resin layer by transiting the polymerizable monomer from the adjacent volume hologram recording material.

The volume hologram laminate of the present invention is characterized in that the resin layer is made of a resin selected from the group consisting of a polymethyl methacrylate resin, a polyvinyl acetate resin, and a polyester resin, and characterized in that a regenerated-center wavelength of the part of the volume hologram laminate provided with the resin layer is on a long-wavelength side when compared to a regenerated-center wavelength of the part of the volume hologram laminate provided with no resin layer.

The volume hologram laminate of the present invention is characterized in that the resin layer is made of a resin selected from the group consisting of a polyvinyl butyral resin and a polyvinyl acetal resin, and characterized in that a regenerated-center wavelength of the part of the volume hologram laminate provided with the resin layer is on a short-wavelength side when compared to a regenerated-center wavelength of the part of the volume hologram laminate provided with no resin layer.

The volume hologram laminate of the present invention is characterized in that a difference between the regenerated-center wavelength of the part of the volume hologram laminate provided with the resin layer and the regenerated-center wavelength of the part of the volume hologram laminate provided with no resin layer is at least 10 nm or more.

A method of producing a volume hologram laminate of the present invention is characterized in that the following processes are sequentially carried out to a laminate obtained by partially coating and forming on a substrate a resin layer and then coating and forming on the substrate so as to adjacent to the resin layer a volume hologram recording material layer comprising a radically polymerizable monomer and a cationic polymerizable monomer; (1) a process of conducting an aging treatment to the laminate and transiting the polymerizable monomer of the volume hologram recording material layer to the resin layer, (2) a hologram exposing process of exposing the laminate with laser from the substrate side, and (3) a hologram fixing process of conducting a heating treatment and an ultraviolet expose treatment to move the polymerizable monomer between the resin layer and the volume hologram recording material layer and fixing a hologram; characterized in that a volume hologram based on the polymerizable monomer transited from the adjacent volume hologram recording material layer is formed on the resin layer; and further characterized in that regenerated-center wavelengths of a part of the laminate provided with the resin layer and a part of the laminate provided with no resin layer are different.

A first volume hologram transferring sheet of the present invention is characterized in that an adhesive layer is provided on the volume hologram layer of the above-mentioned volume hologram laminate.

A second volume hologram transferring sheet of the present invention is characterized in that a second substrate is provided in a peelable manner on the volume hologram layer of the volume hologram laminate, and an adhesive layer is provided on the resin layer and the volume hologram layer of the volume hologram laminate where the substrate is peeled therefrom. Alternatively, a second volume hologram transferring sheet of the present invention is characterized in that a second substrate is provided in a peelable manner on the volume hologram layer of the volume hologram laminate of the present invention, and an adhesive layer is provided on a surface of the volume hologram laminate where the substrate is peeled therefrom.

A volume hologram transferring sheet of the present invention is characterized in that the first or second volume hologram transferring sheet is a volume hologram transfer foil having its adhesive layer as a heat seal layer, or is a volume hologram transfer label having its adhesive layer as a pressure-sensitive adhesive layer.

A volume hologram sticker of the present invention is characterized in that the volume hologram sticker is stuck to an adherend from the adhesive layer side of the above-mentioned first volume hologram transferring sheet, and characterized in that the substrate is peeled and removed or remains to become a protection layer of the volume hologram layer.

A volume hologram sticker of the present invention is characterized in that the volume hologram sticker is stuck to an adherend from the adhesive layer side of the above-mentioned second volume hologram transferring sheet, and characterized in that the second substrate is peeled and removed or remains to become a protection layer of the volume hologram layer.

Effect of the Invention

In the method of producing a volume hologram laminate of the present invention, an effect of producing a volume hologram laminate in an arbitrary wavelength by a simple process can be attained. Further, the volume hologram laminate of the present invention further attains an effect of being able to be produced in a simple process and to regenerate a bright hologram image by controlling the regenerated wavelength. Further in the volume hologram laminate and the volume hologram sticker of the present invention, a volume hologram which has such period of interference fringe that the period of interference fringe of the volume hologram layer adjacent to the resin layer partially provided in the layer direction is enlarged or shrunken compare to the period of interference fringe of the volume hologram layer provided to the part not adjacent to the resin layer in the layer direction. Thus, the regenerated-center wavelengths can be made different between the part where the resin layer is provided and the part where no resin layer is provided in the volume hologram so that a nonconventional design can be obtained. Moreover, even if a contact copy by a single wavelength laser is tried to copy the volume hologram of the part where no resin layer is provided, by using the volume hologram laminate of the present invention as an original master and adhering the volume hologram recording material layer closely thereto, the part where the resin layer is provided and the regenerated-center wavelength thereof is different becomes dark so that copying of the volume hologram fails. Therefore, the volume hologram laminate of the present invention can be made to a laminate excellent in forgery prevention. In addition, the method of producing a volume hologram laminate of the present invention can produce a volume hologram laminate excellent in design and forgery prevention by a simple process, and further, a volume hologram sticker can be easily produced by transfer when the volume hologram transferring sheet of the present invention is used.

BRIEF DESCRIPTION OF DRAWINGS

FIGS. 1A to 1E are a schematic view illustrating one embodiment of the method of producing a volume hologram laminate of the present invention.

EXPLANATION OF REFERENCES

Figure 2:
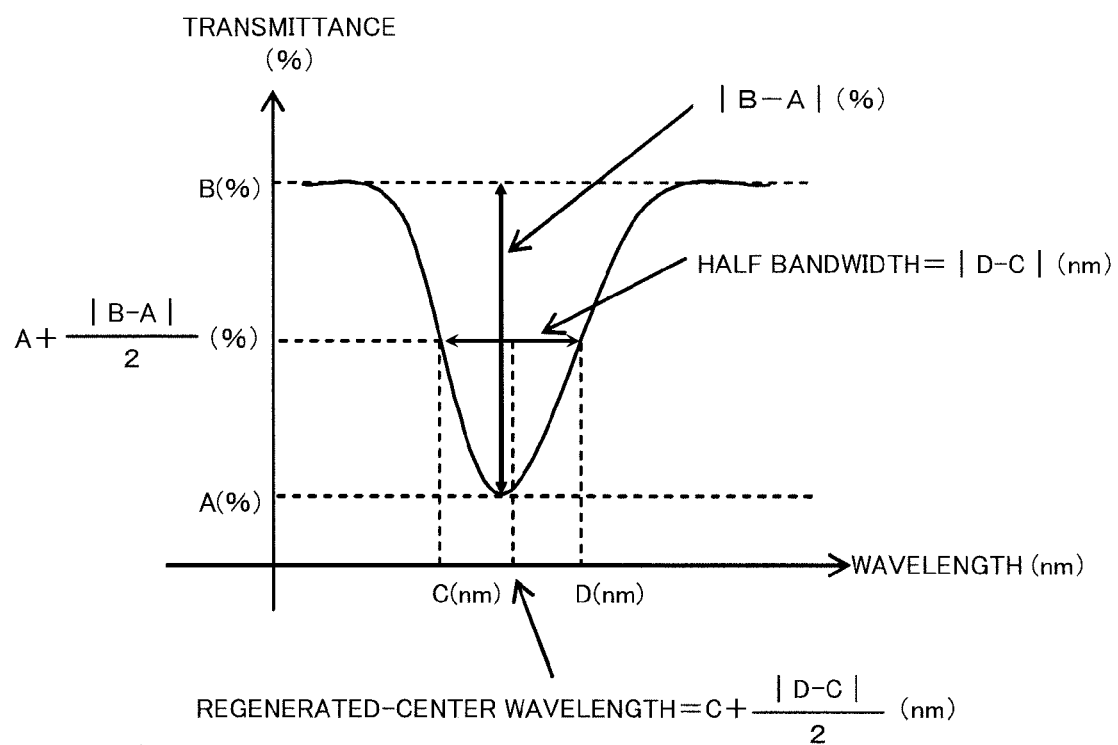
FIG. 2 is a graph illustrating the method to calculate the diffraction efficiency, half bandwidth and regenerated-center wavelength from the spectral transmission curve.

11 . . . Substrate
12 . . . Resin layer
13 . . . Volume hologram layer
110 . . . Volume hologram laminate
110' . . . Volume hologram forming substrate
21 . . . Substrate
22 . . . Volume hologram-laminated part
22a . . . Volume hologram layer
22b . . . Resin layer
210 . . . Volume hologram laminate
220 . . . Volume hologram transfer foil
221 . . . Heat seal layer
230 . . . Volume hologram label
231 . . . Binding layer
1 . . . Substrate
2 . . . Resin layer
3 . . . Volume hologram layer
4 . . . Adhesive layer
5 . . . Peeling sheet
6 . . . Adherend
7 . . . Second substrate
8 . . . Primer layer

BEST MODE FOR CARRYING OUT THE INVENTION

Hereinafter, each embodiment of the present invention will be explained in detail.

A. Method of Producing a Volume Hologram Laminate

First, a method of producing a volume hologram laminate of the present invention will be explained. As explained, the method of producing a volume hologram laminate of the present invention uses a volume hologram forming substrate which comprises: a substrate, a volume hologram layer formed on the substrate and containing a photopolymerizable material, a resin layer, framed on the substrate so as to contact to the volume hologram layer, containing a resin and a polymerizable compound, characterized in that the producing method comprises processes of: a hologram recording process to record a volume hologram to the volume hologram layer, a substance transit process of transiting the polymerizable compound to the volume hologram layer, and an after-treatment process of polymerizing the polymerizable compound.

Such method of producing a volume hologram laminate of the present invention will be explained with reference to the drawings. FIGS. 1A to 1E are a schematic view illustrating the method of producing a volume hologram laminate of the present invention. As shown in FIGS. 1A to 1E, the method of producing a volume hologram laminate of the present invention uses a volume hologram forming substrate 110' which comprises: a substrate 11, a resin layer 12 formed on the substrate 11 and containing a resin and a polymerizable compound, and a volume hologram layer 13 formed on the resin layer 12 so as to contact to the resin layer and containing a photopolymerizable material, (FIG. 1A), characterized in that the producing method comprises processes of: a hologram recording process to record a volume hologram to the volume hologram layer 13 (FIG. 1B), a substance transit process of transiting the polymerizable compound contained in the resin layer 12 to the volume hologram layer 13 (FIG. 1C), and an after-treatment process of polymerizing the polymerizable compound transited to the volume hologram layer 13 (FIG. 1D), and further characterized in that the method produces the volume hologram layer 110 which comprises at least on the substrate 11 the resin layer 12 and the volume hologram layer 13 having a volume hologram recorded FIG. 1E).

According to the present invention, by using as the volume hologram forming substrate a substrate wherein the resin layer and the volume hologram layer are laminated so as to contact each other, and by recording the volume hologram on the volume hologram layer in the hologram recording process and then transiting the polymerizable compound from the resin layer to the volume hologram layer in the substance transit process, it becomes possible to change the period of interference fringe constituting the volume hologram afterward. Because the regenerated wavelength of the volume hologram coincides with the period of interference fringe constituting it, by transiting the polymerizable compound into the volume hologram layer having a volume hologram recorded, it is possible to change the period of interference fringe to the direction to enlarge the period of interference fringe already formed to the volume hologram layer. In the present invention, it is possible to enlarge the period of interference fringe to the arbitrary extent by adjusting the transiting amount of the polymerizable compound. As such, by appropriately adjusting the wavelength of lights used in recording the volume hologram and the transit amount of the polymerizable compound the hologram recording process, it becomes possible to adjust the period of interference fringe afterward so that the volume hologram recorded to the volume hologram layer is made to the volume hologram which can regenerate the hologram image at an arbitrary wavelength. Further, in the present invention, the period of interference fringe can be shorten to an arbitrary extent by selecting the type of the resin layer.

Accordingly, in the present invention, a volume hologram laminate which can reproduce the hologram image in an arbitrary wavelength can be produced by a simple process.

The method of producing a volume hologram laminate of the present invention comprises at least the hologram recording process, the substance transit process and the after-treatment process, and may comprise other optional process as needed.

Hereinafter, each process used in the present invention will be explained in turn.

1. Hologram Recording Process

First, a hologram recording process of the present invention will be explained. The present process is a process to record a volume hologram to a volume hologram layer using a volume hologram forming substrate which comprises: a substrate, a volume hologram layer formed on the substrate and containing a photopolymerizable material, a resin layer, formed on the substrate so as to contact to the volume hologram layer, containing a resin and a polymerizable compound.

Hereinafter, such hologram recording process will be explained in detail.

(1) Volume Hologram Forming Substrate

First, a volume hologram forming substrate used in the present process will be explained. The volume hologram forming substrate used in the present process comprises at least a volume hologram layer, a resin layer, and a substrate.

a. Resin Layer

A resin layer used in the present invention will be explained. The resin layer used in the present invention contains at least a polymerizable compound and a resin. In the present invention, by using such resin layer and by transiting the polymerizable compound to the volume hologram layer in the substance transit process to be explained later, it is possible to produce a volume hologram laminate which can regenerate a hologram image in an arbitrary wavelength.

(Polymerizable Compound)

The polymerizable compound is not particularly limited as long as it can be transited to the volume hologram layer in the substance transit process to be explained later. As such, the polymerizable compound used in the present invention can be appropriately selected according to factors such as the resin to be explained later, the composition of the volume hologram layer, and an embodiment of the substance transit process. In particular, in the present invention, the polymerizable compound is preferably a compound transited from the volume hologram layer. Thereby, for example, it become possible to produce a volume hologram forming substrate used in the present invention by transiting the polymerizable compound contained in the volume hologram layer after laminating a resin layer made of the resin only on the volume hologram layer. Thus, the present invention can be practiced in a simpler method. Further, by making the polymerizable compound to a compound transited from the volume hologram layer, transit of the polymerizable compound to the volume hologram layer in the substance transit process to be explained later may become easier in some cases.

Moreover, the polymerizable compound used in the present invention is preferably a compound which cannot be polymerized by the light irradiated to the volume hologram layer at the time of recording a volume hologram in the present process. If the polymerizable compound is polymerized by the light used in recording the volume hologram in the present process, there is a risk of having difficulty in transiting the polymerizable compound to the volume hologram layer in the substance transit process to be explained later.

As the polymerizable compound used in the present invention, compounds such as a thermally polymerizable compound and a photo polymerizable compound are cited. In the present invention, either of the compounds can be suitably used. Further, the polymerizable compound used in the present invention may be a single kind or plural kinds. In particular, in the present invention, it is preferable to use a compound included in the photopolymerizable material contained in the volume hologram layer (to be explained later) as the polymerizable compound. By using a compound same as the above-mentioned photopolymerizable material contained in the volume hologram layer as the polymerizable compound, it become easy to form a resin layer. In other words, as the volume hologram forming substrate used in the present invention has the resin layer and the volume hologram layer laminated so as to contact each other, for example, by transiting the photopolymerizable material contained in the volume hologram layer to the resin layer at the time of forming the resin layer after the formation of the volume hologram layer, it becomes possible to easily form the resin layer containing the polymerizable compound.

Further, when the photopolymerizable material contained in the volume hologram layer to be explained later contains a radically polymerizable compound and a cationic polymerizable compound, the polymerizable compound contained in the resin layer is preferably identical to the cationic polymerizable compound. The reason is as follows.

By using a radically polymerizable compound and a cationic polymerizable compound as the photopolymerizable material in the present invention, it becomes possible to record a volume hologram having high contrast. In this case, the radically polymerizable compound is to be selectively polymerized in the present process. Thus, by using the cationic polymerizable compound as the polymerizable compound, polymerizable compound is to be polymerized in the present process so that the possibility of disturbing the transit of the polymerizable compound to the volume hologram layer in the substance transit process to be explained later becomes low.

The cationic polymerizable compound will be explained in detail in the section of "b. Volume Hologram Layer" to be explained later so that explanation here is omitted.

An amount of the polymerizable compound contained in the resin layer is not particularly limited as long as it is within the range which allows the desired amount of polymerizable compound to transit to the volume hologram layer in the substance transit process to be explained later. The specific amount contained depends on various factors such as the type of the resin used in the resin layer, composition of the volume hologram layer and a thickness of the resin layer. In particular, in the present invention, it is preferably within the range of 0.1% by mass to 30% by mass, more preferably within the range of 0.1% by mass to 20% by mass, and further preferably within the range of 1% by mass to 10% by mass.

(Resin)

Next, a resin used in the resin layer will be explained. The resin used in the present invention is not particularly limited as long as it has the predetermined transparency. In particular, the resin used in the present invention preferably has a relatively large molecular weight. When the resin has a large molecular weight, it becomes easy to transit the polymerizable compound to the volume hologram layer in the substance transit process to be explained later. Thus, it becomes possible to shift the regenerated wavelength of the hologram images from the wavelength of the light used at the time of recording the volume hologram in the present process to a wavelength of a longer-wavelength side. The specific molecular weight the resin used in the present invention is preferably within the range of 5,000 to 1,000,000, and more preferably within the range of 5,000 to 500,000, and particularly preferably within the range of 10,000 to 300,000.

As examples of the resin used in the present invention, the followings can be cited: various a synthetic resin such as an acrylic-based resin, a styrene-based resin, a polyester-based resin, a urethan-based resin, a polyvinyl-based resin, a cellulose-based resin, an alkyd-based resin, a petroleum-based resin, a ketone-based resin, an epoxy-based resin, a melamine-based resin, a fluorine-based resin, a silicone-based resin, cellulose derivatives, a rubber-based resin, and a mixture thereof; a thermoplastic such as a copolymer; a thermosetting such as a melamine-based resin, a phenol-based resin, a urea-based resin, an epoxy-based resin, an unsaturated polyester-based resin, a diallyl phthalate-based resin, a urethan-based resin, and an amino-alkyd-based resin; and a hardening resin typified by an ionization radiation curing resin, which is cured by the radiation of UV or electron beam, such as an acrylate-based resin, a urethane acrylate-based resin, an ester acrylate resin, and an epoxy acrylate resin.

Further, by using a polyvinyl butyral resin and a polyvinyl acetal resin for the above-mentioned resin, it becomes possible to shift the regenerated-center wavelength to the short-wavelength side.

The resin used in the present invention may be a single kind or plural kinds.

(Optional Compound)

The resin layer used in the present invention may contain other optional compound(s) other than the resin and the polymerizable compound. The optional compound is not particularly limited and a compound which can provide the desired function to the resin layer according to the application of the volume hologram laminate produced by the present invention can be optionally selected. As examples of the optional compound, an antioxidant, a ultraviolet absorber, a light stabilizer, a thermal stabilizer, a plasticizer, a lubricant, an antistat, a flame retardant and a filler can be cited. These compounds may be used alone or in combination in the present invention.

(Resin Layer)

A thickness of the resin layer used in the present invention is not particularly limited as long as it is within the range which allows the containment of the desired amount of the polymerizable compound according to factors such as the type of the resin. The thicker the thickness of the resin layer is, the layer becomes possible to contain larger amount of the polymerizable compound so that it becomes possible to transit them to the volume hologram layer. Accordingly, the thicker the thickness of the resin layer is, the adjustment possibility of the shifted amount of the regenerated wavelength becomes wider. Therefore, it is possible to adjust the thickness of the resin layer to such extent that the regenerated wavelength becomes within the desired range. In particular, in the present invention, the thickness of the resin layer is preferably within the range of 0.1 µm to 10 µm, more preferably within the range of 0.5 µm to 3 µm, and even more preferably within the range of 0.5 µm to 3 µm.

b. Volume Hologram Layer

A volume hologram layer used in the present invention will be explained. The volume hologram layer used in the present invention contains a photopolymerizable material and can record a volume hologram because the interference fringe will be formed in the hologram recording process to be explained later.

Hereinafter, such volume hologram layer will be explained in detail.

(Photopolymerizable Material)

First, a photopolymerizable material used in the present invention will be explained. The photopolymerizable material used in the present invention is not particularly limited as long as the material can progress the polymerization reaction by being irradiated with the predetermined light and can form the interference fringe to the volume hologram layer. In particular, in the present invention, it is preferable to use at least one of the radically polymerizable compound or cationic polymerizable compound. From the view point to enabling the recording of a hologram image with high contrast, it is particularly preferable to combine the radically polymerizable compound and the cationic polymerizable compound.

Further, when the radically polymerizable compound is used as the photopolymerizable material, the photo radical polymerization initiator is preferably used in order to start the polymerization reaction of the radically polymerizable compound. In contrast, when the cationic polymerizable compound is used as the photopolymerizable material, the photo cationic polymerization initiator is preferably used because of the similar reason to the above.

In addition, when the radically polymerizable compound and the cationic polymerizable compound are used as the photopolymerizable material, the photo radical polymerization initiator and the photo cationic polymerization initiator is preferably used.

Since the volume hologram layer of the volume hologram forming substrate is a state before the recording of the volume hologram, the photopolymerizable material is presented in the volume hologram layer in an unpolymerized state.

Hereinafter, the radically polymerizable compound, the cationic polymerizable compound, the photo radical polymerization initiator, and the photo cationic polymerization initiator used in the present invention will be explained in turn.

First, the cationic polymerizable compound used in the present invention will be explained. The cationic polymerizable compound used in the present invention is a compound which cationic-polymerizes, when being irradiated with energy, by a Brønsted acid or a Lewis acid generated through the decomposition of the photo cationic polymerization initiator to be explained later.

When the radically polymerizable compound and the cationic polymerizable compound is used as the photopolymerizable material, the recording of volume hologram in the present process is generally carried out by irradiating the energy to the entire surface and to polymerize the uncured substance such as the cationic polymerizable compound, after the radically polymerizable compound is polymerized at the part having a large light intensity in the interference fringe at the time of interference exposure. At this time, the laser used in forming the hologram image and the energy irradiated to the entire surface have generally different wavelengths. Thus, the cationic polymerizable compound used in the present invention is preferably a compound which does not polymerize at the wavelength of the light source used in forming the hologram image.

Further, from the view point that the polymerization of the radically polymerizable compound is preferably conducted in the composition having a relatively low viscosity, the cationic polymerizable compound used in the present invention is preferably in a liquid form at room temperature.

As examples of such cationic polymerizable compound, compounds described in the following references can be cited: Chemtec. October, J. V. Crivello, page 624 (1980); JP-A NO. 62-149784; Journal of the Adhesion Society of Japan (Vol. 26, No. 5, pages 179-187 (1990)); JP-A NO. 5-107999; JP-A NO. 2002-236439; and JP-A NO. 2002-236440.

In the present invention, each of the cationic polymerizable compounds can be suitable use. In particular, a cationic polymerizable compound having three or more polymerization functional group per one molecule is preferable. Thereby, a crosslink density in the volume hologram layer can be made higher and the foil cuttability of the volume hologram layer is made excellent.

The cationic polymerizable compound used in the present invention may be of a single kind or be two or more kinds.

Next, the radically polymerizable compound used in the present invention will be explained. The radically polymerizable compound used in the present invention is not particularly limited as long as it is a compound which polymerizes by the action of the active radical generated from the photo radical polymerization initiator to be explained later, at the time of forming the volume hologram layer through, for example, laser irradiation. In the present invention, a compound having at least one ethylenic unsaturated double bond in a molecule is preferable.

Here, the volume hologram layer is a layer which forms the interference fringe and forms a hologram image by polymerizing the radically polymerizable compound with a light such as a laser light or a light having excellent coherence. Thus, for the radically polymerizable compound and the cationic polymerizable compound, compounds having different refractive indexes are generally selected. The magnitude relation in the refractive indexes between the radically polymerizable compound and the cationic polymerizable compound used in the present invention is not particularly limited. However, in particular, the average refractive index of the radically polymerizable compound is preferably larger than that of the cationic polymerizable compound from the view point of material selectivity. Specifically, the difference in the average refractive index is preferably 0.02 or larger. This is because, when the difference in the average refractive indexes between the radically polymerizable compound and the cationic polymerizable compound is smaller than the above-mentioned value, refractive-index modulation becomes insufficient and it may become difficult to form a highly precise hologram image.

The average refractive index mentioned here denotes the average value of the refractive indexes obtained by measuring polymers obtained through polymerizing the cationic polymerizable compound or the radically polymerizable compound polymerization. Moreover, the average refractive index mentioned in the present invention denotes the vale measured by the abbe refractometer.

As examples of the radically polymerizable compound used in the present invention, compounds described in the following references can be cited: JP-A NO. 5-107999, JP-A NO. 2002-236439, and JP-A No. 2002-236440. Further, the radically polymerizable compound in the present invention may be of a single kind or be a mixture of two or more kinds.

Next, the photo radical polymerization initiator used in the present invention will be explained. The photo radical polymerization initiator used in the present invention is not particularly limited as long as it is an initiator which can polymerize the radically polymerizable compound by generating the active radical through the irradiated light at the time of forming the volume hologram to the volume hologram layer in the present process. As examples of such photo radical polymerization initiator, an initiator described in the following references can be cited: U.S. Pat. Nos. 4,766,055, 4,868, 092, 4,965,171, JP-A No. 54-151024, JP-A No. 58-15503, JP-A No. 58-29803, JP-A No. 59-189340, JP-A No. 60-76735, JP-A No. 1-28715, Japanese Patent Application NO. 3-5569, and "PROCEEDINGS OF CONFERENCE ON RADIATION CURING ASIA (Pages 461-477, 1988)".

Next, the photo cationic polymerization initiator used in the present invention will be explained. The photo cationic polymerization initiator used in the present invention is not particularly limited as long as it is a compound which can polymerize the cationic polymerizable compound by generating a Brønsted acid or a Lewis acid by the irradiated energy. In particular, in the present invention, the radically polymerizable compound is preferably a compound which does not react with a light such as a laser light or a light having excellent coherence and is low in photosensitivity which photosensitizes to the energy irradiated to the entire surface afterwards. Thereby, the cationic polymerizable compound can remain with almost no reaction at the time of polymerizing the radically polymerizable compound so that a large refractive-index modulation is obtained in the volume hologram layer.

The photo cationic polymerization initiator low in photosensitivity to a light such as a laser light or a light having excellent coherence denotes an agent which shows maximum value 500 mW or lower (including 0 mW) per 1 mg measurement sample in the DSC value which results from a photopolymerization initiated by the photo cationic polymerization initiator when the heat analysis is conducted under the following conditions.

(Measuring Conditions)

Measuring Device: differential scanning calorimeter DSC 220 and light sourcing device UV-1 are used in heat analysis system SSC5200H manufactured by Seiko Instruments Inc.

Measurement Sample: prepared by dissolving the subjected-photo cationic polymerization initiator 3% by mass into UVR-6110 (cationic polymerizable compound) manufactured by Union Carbide Corporation (may also be prepared by adding, dissolving and evaporating an organic solvent).

Irradiating light: irradiate a light adjusted to the laser light or a light having excellent coherence using an interference filter (half bandwidth about 10 nm) by 200 mJ/cm$^2$.

As examples of such photo cationic polymerization initiator, an initiator described in the following references can be cited: "UV Curing: Science and Technology", pages 23-76, edited by S. PeterPappas, A Technology Marketing Publication; "Comments Inorg. Chem.", B. Klingert, M. Riediker and A. Roloff, Vol. 7, No. 3, pages 109-138 (1988); JP-A No. 5-107999, JP-A No. 2002-236439 and JP-A No. 2002-236440. Further, in the present invention, one or plural kinds of the above can be used.

(Optional Compound)

The volume hologram layer used in the present invention may contain other optional compounds) other than the photopolymerizable material mentioned above. The optional compound used in the present invention is not particularly limited as long as the compound can provide the desired function to the volume hologram layer according to factors such as an application of the volume hologram laminate produced by the present invention. As examples of such optional compound, a sensitizing dye, fine particles, an anti-heat polymerization agent, a silane coupling agent, a plasticizer, a coloring agent, and a polymer bonding agent can be cited. In particular, in the present invention, a binder resin, fine particles and a sensitizing dye is preferably used. This is because, by using a binder resin, it is possible to obtain a uniform the volume hologram layer and maintain hologram image formed by the polymerization of the radically polymerizable compound.

Further, by using fine particles, it is possible to provide the desired foil cuttability to the volume hologram layer.

In addition, many of the photopolymerizable materials are active to the UV. By using a sensitizing dye, the materials become also active to the visible light and thereby it becomes possible to record the volume hologram using the visible laser.

As examples of the binder resin, poly(meth)acrylic acid ester or a partial hydrolysate thereof, polyvinyl acetate or a hydrolysate thereof, polyvinyl alcohol or a partial acetal compound thereof, triacetyl cellulose, polyisoprene, polybutadiene, polychloroprene, silicone rubber, polystyrene, polyvinyl butyral, polyvinyl chloride, polyarylate, chlorinated polyethylene, chlorinated polypropylene, poly-N-vinyl carbazole or a derivative thereof, poly-N-vinylpyrrolidone or a derivative thereof and a copolymer of styrene and maleic acid anhydride or a half ester thereof. Further, a copolymer obtained by polymerizing at least one monomer selected from the group consisting of acrylic acid, acrylic acid ester, methacrylic acid, methacrylic acid ester, acrylamide, acrylonitrile, ethylene, propylene, chloroethene and vinyl acetate. Moreover, in the present invention, a single kind or a mixture of plural kinds of these binder resins may be used alone.

In addition, a hardening resin of oligomer type may be used as the binder resin. As examples of the resin, an epoxy compound generated through a condensation reaction of various phenol compounds such as bisphenol A, bisphenol S, novolac, o-cresolnovolac, and p-alkylphenolnovolac, and Epichlorohydrin can be cited.

(Volume Hologram Layer)

The volume hologram layer used in the present invention preferably has a glass-transition point of 100° C. or higher. Thereby, the volume hologram layer becomes stable even when a heat is applied to the layer, and it becomes possible to transfer the volume hologram layer by a method such as a heat transfer method.

A thickness of the volume hologram layer used in the present invention is not particularly limited as long as the desired hologram image can be obtained. Normally, the thickness is preferably within the range of 1 μm to 50 μm, more preferably within the range of 3 μm to 40 μm, and even more preferably within the range of 5 μm to 30 μm.

c. Substrate

Next, a substrate used in the present invention will be explained. The substrate used in the present invention has a function to support the above-mentioned resin layer and volume hologram layer.

The substrate used in the present invention is not particularly limited as long as it can support the resin layer and volume hologram layer. For example, a common polyester film such as a polyethylene terephthalate film can be used as the substrate.

Further, a thickness of the substrate used in the present invention is appropriately selected according to factors such as an application and kind of the volume hologram laminate produced in the present invention. Generally, the thickness is within the range of 2 μm to 200 μm, and is preferably within the range of 10 μm to 50 μm.

When the adhesion between the substrate and the resin layer or the volume hologram layer used in the present invention is insufficient, the adhesion can be improved by between the substrate and the resin layer or the volume hologram layer by conducting a surface treatment such as a corona treatment, an ozonation treatment, a plasma treatment, an ionization radiation treatment, a bichromatic treatment, an anchoring or primer treatment to the substrate surface. As the primer, various primer agent such as urethane-based, acrylic-based, ethylene-vinyl acetate copolymer-based, and chloroethene-vinyl acetate copolymer-based are known. A suitable for the substrate can be selected from the above.

d. Volume Hologram Forming Substrate

A volume hologram forming substrate used in the present process comprises the above-mentioned substrate, resin layer and volume hologram layer. An embodiment wherein these members are formed is not particularly limited as long as it is an embodiment wherein the resin layer and the volume hologram layer are laminated so as to contact each other. Thus, the volume hologram forming substrate used in the present invention may have an embodiment wherein the resin layer and the volume hologram layer are laminated on the substrate in this order, or may have an embodiment wherein the volume hologram layer and the resin layer are laminated on the substrate in this order. The embodiment of the volume hologram forming substrate used in the present invention is appropriately selected from factors such as a method employed in recording the volume hologram in the hologram recording process to be explained later. For example, when a method of recording the volume hologram using the hologram original master in the hologram recording process is employed, it is desired to provide the hologram original master close to the volume hologram layer. Accordingly, an embodiment of volume hologram forming substrate used in the present invention is preferably the one wherein the resin layer and the volume hologram layer are laminated on the substrate in this order.

The volume hologram forming substrate used in the present invention comprises at least the resin layer, the volume hologram layer, and the substrate, but it may have an optional technical structure as needed. The optional technical structure used in the present invention is not particularly limited, and a technical structure having the desired function according to an application of the volume hologram laminate produced in the present invention may be used. As examples of such technical structure, a hard coat layer, a static charge prevention layer, a printing layer, an ink-receiving layer and a releasing layer can be cited.

e. Producing Method of Volume Hologram Forming Substrate

Next, a method of producing the volume hologram forming substrate used in the present invention will be explained. The volume hologram forming substrate used in the present invention can be produced by a method wherein the resin layer and the volume hologram layer are separately formed on the substrate in this order. However, the following methods are preferable because they can produce the substrate in a simpler producing process: a method, wherein a resin layer containing no polymerizable compound is formed on a substrate, then a volume hologram layer is formed on the resin layer and further, a part of a photopolymerizable material contained in the volume hologram layer is transited to the resin layer; or a method, wherein a volume hologram layer is formed on a substrate, then a resin layer containing no polymerizable compound is formed on the volume hologram layer, and further, a part of a photopolymerizable material contained in the volume hologram layer is transited to the resin layer.

Hereinafter, these methods will be explained as examples of the method to produce a volume hologram forming substrate used in the present invention.

First, a method of forming the resin layer containing no polymerizable compound on the substrate will be explained. In the method of forming the resin layer containing no polymerizable compound on the substrate, a common method of forming a layer made of a resin material can be used. For example, a method of coating a molten material of a resin or a coating solution prepared by dissolving a resin into a solvent on the substrate, and a method of attaching a film made of a resin to the substrate, can be cited. In the present invention, either of method can be suitably used according to the type of the resin used in the resin layer.

Next, a method of forming the volume hologram layer on the resin layer will be explained. As a method of forming the volume hologram layer on the resin layer, for example, a method of coating a solution prepared by dissolving a photopolymerizable material on the resin layer, and a method of attaching a film containing a photopolymerizable material to the resin layer, can be cited.

Next, a method of transiting the photopolymerizable material contained in the volume hologram layer to the resin layer will be explained. As the resin layer and the volume hologram layer are formed in a manner they contact each other, it is generally possible to transit the photopolymerizable material to the resin layer under the principle of equilibrium shift by heating the resin layer and the volume hologram layer together. At this time, it is possible to arbitrary adjust the transit amount of the photopolymerizable material by controlling the heating time and heating temperature.

When the method of coating a solution having the photopolymerizable material dissolved therein is used as the method of forming the volume hologram layer on the resin layer, a separate process such as heating process as explained above may not be needed in some cases, because it is possible to transit the photopolymerizable material to the resin layer due to the penetration of the solution to the resin layer caused when the solution is coated on the resin layer.

Further, when the method, wherein a volume hologram layer is formed on a substrate, then a resin layer containing no polymerizable compound is formed on the volume hologram layer, and further, a part of a photopolymerizable material contained in the volume hologram layer is transited to the resin layer, is used, a volume hologram forming substrate can be produced by the above-mentioned method other than reversing the forming order of the resin layer and the volume hologram.

(2) Volume Hologram Recording Process

Next, a method of recording the volume hologram to the volume hologram layer provided to the above-mentioned volume hologram forming substrate will be explained.

The volume hologram is to record a hologram image by fixing the interference fringe generated by light interference to the volume hologram layer containing the photopolymerizable material as a fringe having different refractive indexes. Accordingly, the method of recording the volume hologram in the present process is not particularly limited as long as it is a method which allows the recording of the predetermined interference fringe to the volume hologram layer. As examples of such method, the following methods can be cited: a method of injecting a reference light beam from the substrate side of the volume hologram forming substrate, injecting an object light beam from the volume hologram layer side and making these lights interfere in the volume hologram layer; and a method of providing a hologram original master on the volume hologram layer, and making the injected light and the reflected light reflected by the hologram original master interfere in the volume hologram layer by injecting the light from the substrate side. Either method can be used suitably in the present process. In particular, the method of using the above-mentioned hologram original master is preferable. This is because, such a method allows a simple and easy recording of the volume hologram.

When the above-mentioned method of using the hologram original master is employed in the present process, a substrate having the resin layer and the volume hologram layer laminated in this order on the substrate is used as the volume hologram forming substrate for the present process.

When a photopolymerizable material containing a single photo polymerizable compound is used as the photopolymerizable material for the volume hologram layer, the volume hologram is to be recorded by polymerizing the photo polymerizable compound in the present process. However, when a photopolymerizable material containing plural photo polymerizable compounds is used as the photopolymerizable material, it is sufficient to polymerize at least one photo polymerizable compound in order to record the volume hologram in the present process.

When the material containing the above-mentioned radically polymerizable compound and cationic polymerizable compound is used as the photopolymerizable material, the volume hologram is generally recorded by polymerizing the radically polymerizable compound in the present process.

2. Substance Transit Process

Next, substance transit process of the present invention will be explained. The present process is a process to transit the polymerizable compound contained in the resin layer to the volume hologram layer having a volume hologram recorded in the hologram recording process. Further, the present process can also be regarded as a process of arbitrary enlarging the period of interference fringe recorded to the volume hologram layer by transiting the polymerizable compound from the resin layer to the volume hologram layer, and thereby enabling the regeneration of the volume hologram recorded to the volume hologram layer at an arbitrary wavelength.

In present process, the method of transiting the polymerizable compound from the resin layer to the volume hologram layer is not particularly limited as long as it is a method which transits the desired amount of polymerizable compound and to make the period of interference fringe recorded to the volume hologram layer within the predetermined range. As examples of such method, the following can be cited: a method to leave the resin layer and the volume hologram layer in contacting state for the predetermined time, and a method of heating the resin layer and the volume hologram layer together. Either of the methods can be suitably used in the present process, however, the method of heating the resin layer and the volume hologram layer together is preferable. This is because, such method allows arbitrary adjustment of the transiting amount of the polymerizable compound by controlling factors such as the heating time and heating temperature.

3. After-Treatment Process

Next, the after-treatment process of the present invention will be explained. The present process is a process of polymerizing the above-mentioned polymerizable compound.

A method of polymerizing the polymerizable compound is appropriately selected according to the type of the polymerizable compound. In other words, when the polymerizable compound is a photo polymerizable compound, a method of irradiating a light which can induce the polymerization reaction according to the kind of the photopolymerization functional group of the photo polymerizable compound is employed. When the polymerizable compound is a thermally polymerizable compound, a heating treatment method which can induce the polymerization reaction of the thermal polymerization functional group of the thermally polymerizable compound will be employed.

Here, since the polymerizable compound is transited to the volume hologram layer in the above-mentioned substance transit process, the polymerizable compounds are contained in both of the resin layer and the volume hologram layer at the time of the present process. Accordingly, in the present process, the polymerizable compounds contained in the resin layer and the volume hologram layer are generally simultaneously polymerized.

The polymerizable compound contained in the resin layer and the volume hologram layer is not to be transited after this process because it is fixed by the polymerization of the present process. Thus, the regenerated wavelength of the volume hologram is to be fixed in the present process.

4. Volume Hologram Laminate

Next, a volume hologram laminate produced in the present invention will be explained. As the volume hologram laminate produced in the present invention uses the above-mentioned volume hologram forming substrate, the volume hologram laminate produced in the present invention comprises the substrate, the resin layer formed on the substrate, and the volume hologram layer framed on the substrate so as to contact to the resin layer.

Further, since the volume hologram laminate produced in the present invention is a laminate wherein the volume hologram is recorded to the volume hologram layer, the volume hologram layer has at least the interference fringe recorded, but the resin layer may also have the interference fringe recorded depending on the kind of the polymerizable compound contained in the resin layer. At this time, when the period of interference fringe formed to the volume hologram layer and the period of interference fringe formed to the resin layer are different, the hologram image can be regenerated at plural wavelengths. Thus, it is possible to obtain a volume hologram laminate which can regenerate a bright hologram image.

Here, the volume hologram laminate produced in the present invention is to have features resulting from the fact that it is produced by the producing method of a volume hologram explained in the present invention. That is, the volume hologram laminate produced in the present invention has a feature that a spherical domain is produced in at least one of the volume hologram layer and the resin layer.

Figure 3:
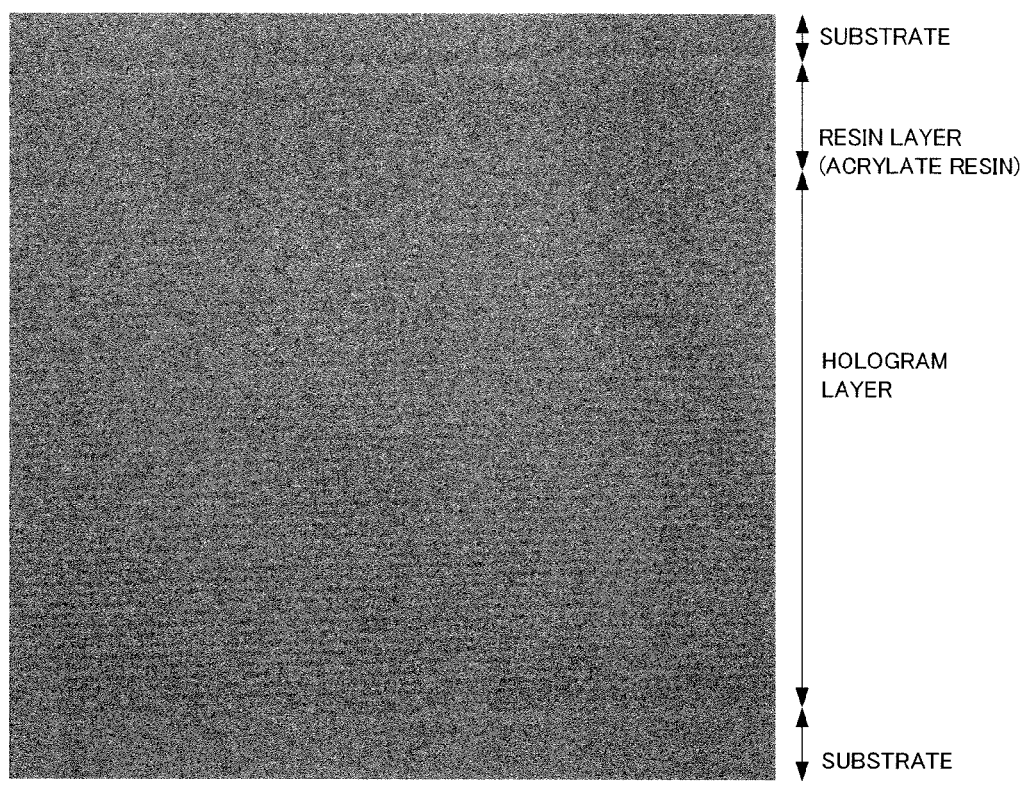
FIG. 3 is an electronmicrograph showing one example of a spherical domain which is formed on the volume hologram layer and the resin layer of the volume hologram laminate produced by the method of producing a volume hologram laminate of the present invention.
Figure 4:
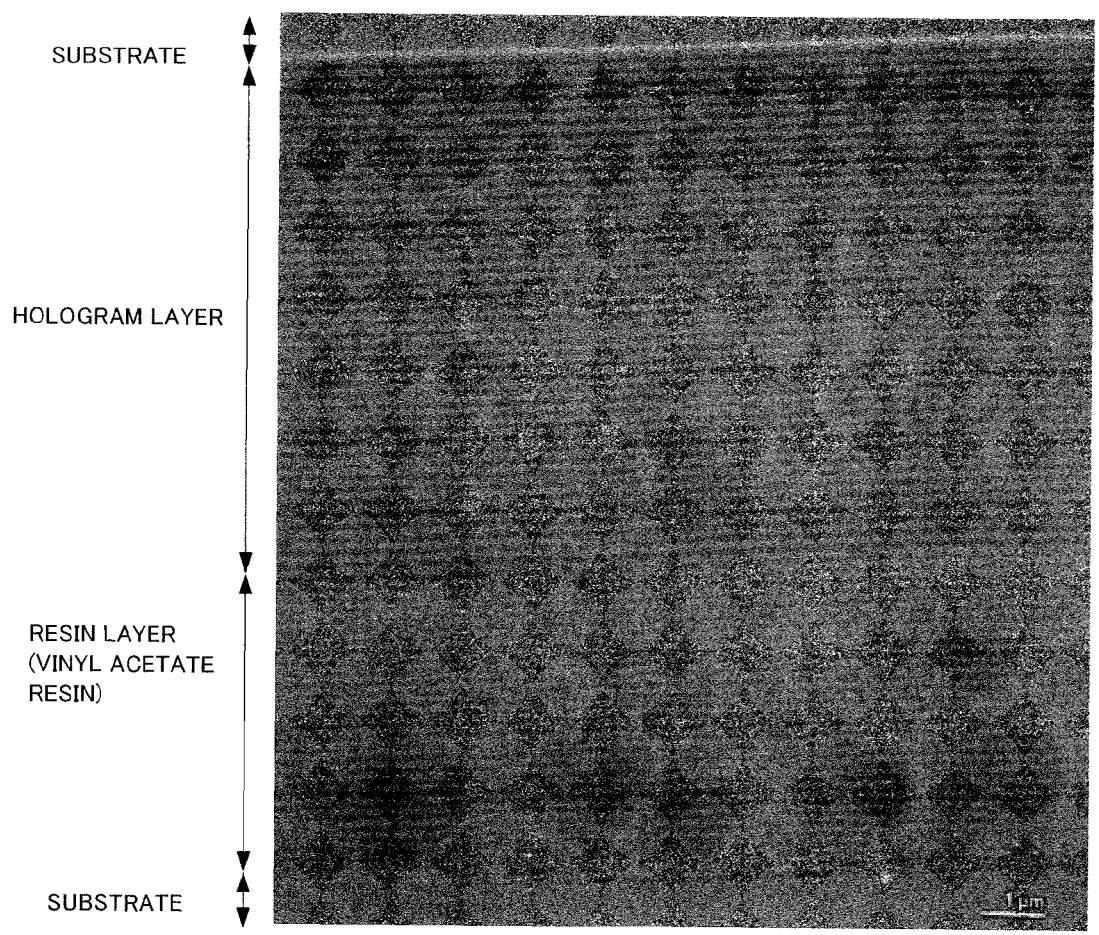
FIG. 4 is an electron micrograph showing another example of a spherical domain which is formed on the volume hologram layer and the resin layer of the volume hologram laminate produced by the method of producing a volume hologram laminate of the present invention.
Figure 5:
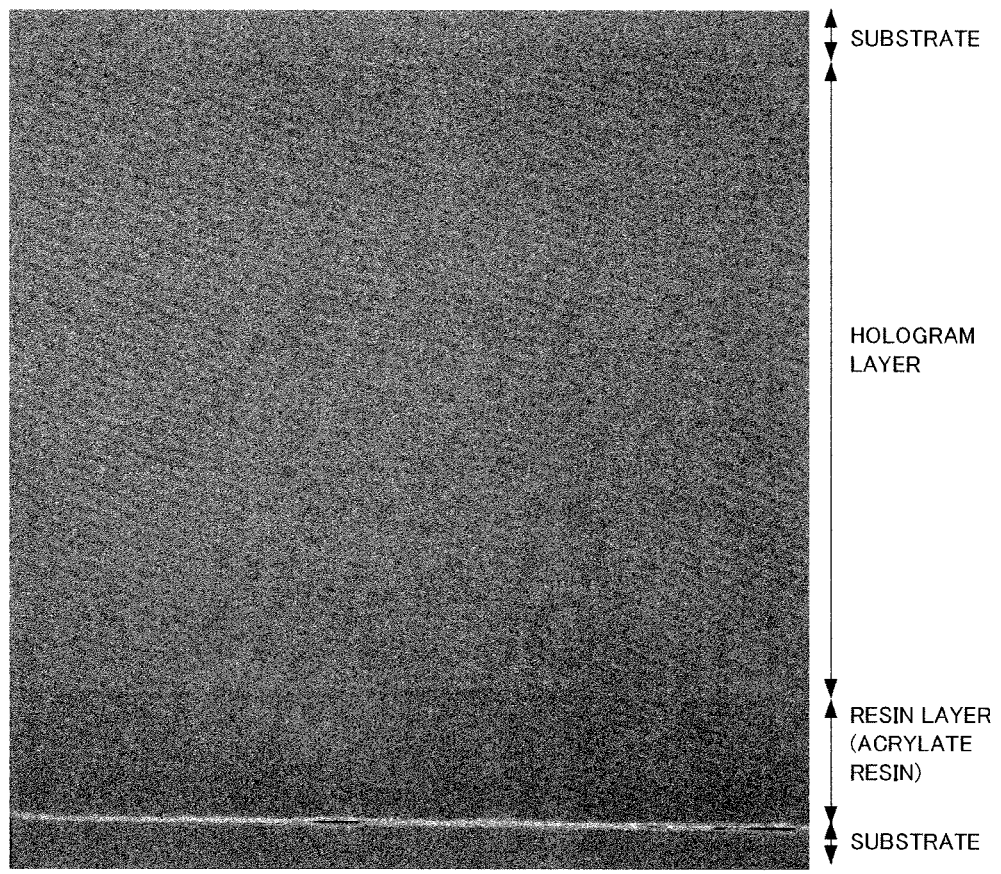
FIG. 5 is an electron micrograph showing yet another example of a spherical domain which is formed on the volume hologram layer and the resin layer of the volume hologram laminate produced by the method of producing a volume hologram laminate of the present invention.

The spherical domain formed on the volume hologram layer and the resin layer of the volume hologram laminate produced by the present invention will be specifically explained by showing examples. FIGS. 3 to 5 are each an electron micrograph showing an example of a spherical domain formed on the volume hologram layer and the resin layer of the volume hologram laminate produced by the method of producing a volume hologram laminate of the present invention. As respectively shown in FIGS. 3 to 5, the volume hologram laminate produced by the present invention is a laminate where a spherical domain is formed on the volume hologram layer and the resin layer.

As shown, the volume hologram laminate produced by the present invention is characterized in that a spherical domain is formed on the volume hologram layer and the resin layer, whether a given volume hologram laminate is produced by the producing method of the present invention can be easily judged by the presence of the above-mentioned spherical domain. The presence of the spherical domain can be clearly confirmed by observing the cross-sections of the volume hologram layer and the resin layer under the transmission electron microscope.

B. Volume Hologram Laminate (First embodiment)

Next, the volume hologram laminate of the first embodiment of the present invention will be explained.

The volume hologram laminate of the present invention comprises: a substrate, a volume hologram layer formed on the substrate and containing a photopolymerizable compound, in which a volume hologram is recorded by forming an interference fringe, and a volume hologram-laminated part formed so as to contact to the volume hologram layer and comprising a resin layer which contains a transparent resin, characterized in that an interference fringe is formed on the resin layer.

Figure 6:
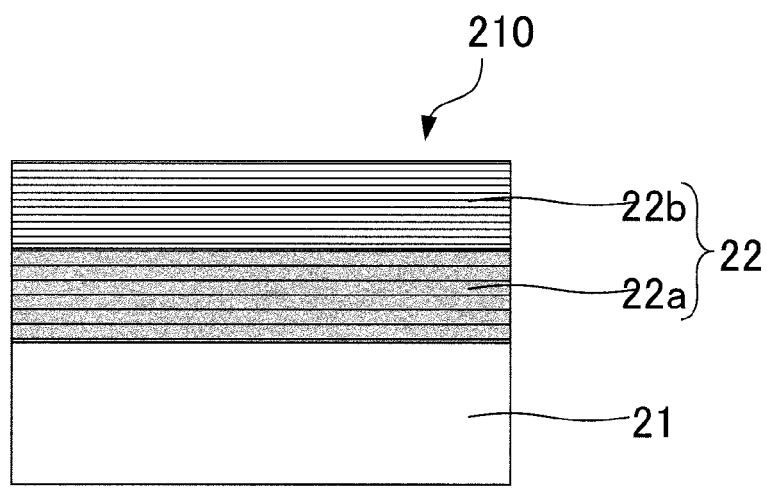
FIG. 6 is a schematic view illustrating the volume hologram laminate (first embodiment) of the present invention.

The volume hologram laminate of the present invention will be explained with reference to the drawings. FIG. 6 is a schematic view illustrating the volume hologram laminate of the present invention. As shown in FIG. 6, volume hologram laminate 210 of the present invention volume hologram laminate comprises: a substrate 21, a volume hologram layer 22a fanned on the substrate 21, and a volume hologram-laminated part 22 formed so as to contact to the volume hologram layer 22a and comprising a resin layer 22b which contains a transparent resin. Here, the volume hologram layer 22a contains the photo polymerizable compound and is a layer having the volume hologram recorded by forming the interference fringe. In such an embodiment, the volume hologram laminate 210 of the present invention is characterized in that the interference fringe is formed to the resin layer 22b. In other words, the volume hologram laminate 210 of the present invention is characterized in that the interference fringes are formed to both of the volume hologram layer 22a and the resin layer 22b.

Here, the embodiment for the volume hologram laminate of the present invention wherein the volume hologram layer and the resin layer are laminated on the substrate in this order is explained. However, the volume hologram laminate of the present invention is not limited to this technical structure. The volume hologram laminate of the present invention may have a technical structure wherein a resin layer and the volume hologram layer are laminated on the substrate in this order.

According to the present invention, because the interference fringe is also formed on the resin layer, by arbitrary controlling the respective periods of interference fringes formed on the volume hologram layer and the resin layer, it is possible to obtain a volume hologram laminate which can regenerate the bright hologram image at an arbitrary wavelength. Further, because the resin layer is formed so as to contact to the volume hologram layer in the present invention, the volume hologram laminate of the present invention can be produced by, for example, a method of simultaneously recording the interference fringes to the resin layer and the volume hologram layer after the volume hologram layer is directly formed on the resin layer. Accordingly, a volume hologram laminate which can be produced in a simple method is obtained in the present invention. Thus, according to the present invention, it is possible to provide a volume hologram laminate which can be produced in a simple process and which can regenerate a bright hologram image by controlling the regenerated wavelength.

The volume hologram laminate of the present invention comprises at least the substrate and the volume hologram-laminated part and may comprise other technical structure as needed. Hereinafter, each technical structures of the present invention will be explained in turn.

1. Volume Hologram-Laminated Part

First, a volume hologram laminated part used in the present invention will be explained. The volume hologram laminated part used in the present invention is formed by laminating the volume hologram layer where the volume hologram is recorded and the resin layer containing the transparent resin as such that they contact each other.

1-1: Resin Layer

First, a resin layer used in the present invention will be explained. The resin layer used in the present invention contains a transparent resin and has an interference fringe formed. Hereinafter, such resin layer will be explained.

(1) Interference Fringe

As explained, the resin layer of the present invention has the interference fringe formed, but the period of interference fringe formed on the resin layer is not particularly restricted and can be arbitrary decided according to factors such as the period of interference fringe formed on the volume hologram layer to be explained later.

Here, the formation of the interference fringe in the resin layer used in the present invention can be confirmed by observing a section, obtained by cutting the resin layer to the thickness direction, under a transmission electron microscope (TEM).

Further, the "period of interference fringe" used in the present invention denotes a distance between the adjacent bright fringes or between adjacent dark fringes. The period of interference fringe can be obtained by calculating it from the interference fringe of the cross-section photographed by the transmission electron microscope (TEM) based on TEM diameter, while also by measuring the wavelength dependency of the transmission of the resin layer. That is, since the light having the wavelength which satisfies the bragg conditions obtained by the period of interference fringe among the light injected from a certain direction to the resin layer is to be diffracted in the resin layer, the wavelength dependency of the transmission of the resin layer shows the minimal value at the wavelength which satisfies the bragg conditions. Accordingly, it is possible to obtain the period of interference fringe by obtaining the minimum transmitted-wavelength in the wavelength dependency of the transmission. In the method of obtaining the period using the transmission electron microscope, the period of interference fringe of the resin layer is typified by the average period of the parts whose periodic fringes are clearly photographed out of photographed interference fringes.

The periods of interference fringe formed to the resin layer used in the present invention may be constant or different. When the interference fringes have plural different periods, the embodiment of forming interference fringes having different periods may be an embodiment wherein the period of interference fringes formed in a successively changing manner, or may be an embodiment wherein the interference fringes having different periods are formed in an intermittent manner.

Further, the period of interference fringe formed on the resin layer used in the present invention may be identical to or different from the period of interference fringe formed on the volume hologram layer to be explained later. In particular, in the present invention, the period of interference fringe formed on the resin layer used in the present invention is preferably different from the period of interference fringe formed on the volume hologram layer to be explained layer. Thereby, because the hologram image can be regenerated at a wavelength which coincides with one of the periods of interference fringes formed on the resin layer and the volume hologram layer, it becomes possible to regenerate the hologram image at plural regenerated wavelengths so that the volume hologram laminate of the present invention can be made to the laminate which can regenerate brighter hologram image.

When the period of interference fringe formed on the resin layer is different from the period of interference fringe formed on the volume hologram layer to be explained later, the period of interference fringe formed on the resin layer may be bigger or smaller than the period of interference fringe formed on the volume hologram layer.

Here, in the present invention, the period of interference fringe formed on the resin layer is "different" from the period of interference fringe formed on the volume hologram layer (to be explained later) denotes that there is at least 3 nm or more difference between the periods of interference fringes for both layers.

(2) Transparent Resin

Next, the transparent resin will be explained. The transparent resin used in the present invention is not particularly limited as long as it has the predetermined transparency. Here, the transparent resin used in the present invention is the same as that explained in the above-mentioned section of "A. Method of Producing Volume Hologram Laminate", explanation here is omitted.

(3) Optional Compound

In the resin layer used in the present invention, optional compound(s) may be included arbitrary other than the transparent resin. The optional compound is not particularly limited and one which can provide the desired function(s) to the resin layer can be arbitrary selected according to the application of the volume hologram laminate of the present invention. Here, the optional compound is the same as that explained in the above-mentioned section of "A. Method of Producing Volume Hologram Laminate", explanation here is omitted.

(4) Resin Layer

A thickness of the resin layer used in the present invention is not particularly limited as long as it can make the volume hologram laminate of the present invention to a laminate which can regenerate a hologram image at the desired wavelength according to the factors such as the kind of the transparent resin.

1-2: Volume Hologram Layer

Next, a volume hologram layer used in the present invention will be explained. The volume hologram layer used in the present invention contains a photo polymerizable compound, in which the volume hologram is recorded by forming an interference fringe.

Hereinafter, such volume hologram layer will be explained.

(1) Interference Fringe

As explained above, the volume hologram layer used in the present invention has an interference fringe formed. The periods of interference fringes formed to the volume hologram layer may be constant or different. When the interference fringes have plural different periods, the embodiment of forming interference fringes having different periods may be an embodiment wherein the period of interference fringes are formed in a successively changing manner or may be an embodiment wherein the interference fringes having different periods are formed in an intermittent manner.

The period of interference fringe formed on the volume hologram layer used in the present invention may be identical to or different from the period of interference fringe formed on the resin layer explained above. In particular, in the present invention, the above-mentioned period of interference fringe formed on the resin layer is preferably different from the period of interference fringe formed on the volume hologram layer. Thereby, because the hologram image can be regenerated at a wavelength which coincides with one of the periods of interference fringes formed on the resin layer and the volume hologram layer, it becomes possible to regenerate the hologram image at plural regenerated wavelengths so that the volume hologram laminate of the present invention can be made to the laminate which can regenerate brighter hologram image. The embodiment wherein the period of interference fringe formed on the above-mentioned resin layer is different from the period of interference fringe formed on the volume hologram layer is explained in the above-mentioned section of "1-1. Resin Layer" as the embodiment of the interference fringe formed on the resin layer. Thus explanation here is omitted.

The specific period of the interference fringes formed to the volume hologram layer used in the present invention is equivalent to the wavelength of visible light range.

(2) Photo Polymerizable Compound

Next, the photo polymerizable compound contained in the volume hologram layer will be explained. The photo polymerizable compound contained in the volume hologram layer is not particularly limited as long as it can progress the polymerization reaction by being irradiated with the predetermined light and can form the interference fringe to the volume hologram layer. The photo polymerizable compound contained in the volume hologram layer is identical to those explained in the above-mentioned section of "A. Producing Method of Volume Hologram Laminate", thus explanation here is omitted.

Since the volume hologram layer of the present invention is the layer having the recorded-volume hologram, the photo polymerizable compound is to be contained in the volume hologram layer as a polymerized product.

(3) Optional Compound

The volume hologram layer used in the present invention may contain other optional compound(s) other than the above-mentioned photo polymerizable compound. The optional compound used in the present invention can be appropriately selected according to factors such as an application of the volume hologram laminate of the present invention. As the optional compound used in the volume hologram layer of the present invention is identical to those explained in the above-mentioned section "A. Producing Method of Volume Hologram Laminate", explanation here is omitted.

1-3. Volume Hologram-Laminated Part

A volume hologram-laminated part used in the present invention is formed on the substrate to be explained later. An embodiment wherein the volume hologram-laminated part used in the present invention is formed on the substrate may be: an embodiment wherein the volume hologram layer side is formed so as to be provided to the substrate side; or an embodiment wherein the resin layer side is formed so as to be provided the substrate side.

2. Substrate

Next, a substrate used in the present invention will be explained. The substrate used in the present invention has a function to support the above-mentioned volume hologram-laminated part. As the substrate used in the present invention is identical to those explained in the above-mentioned section of "A. Producing Method of Volume Hologram Laminate", explanation here is omitted.

3. Optional Technical Structure

The volume hologram laminate of the present invention comprises at least the volume hologram-laminated part and the substrate, it may also has other optional technical structure as needed. The optional technical structure used in the present invention is not particularly limited and a structure which has the desired function according to an application of the volume hologram laminate of the present invention may be used.

4. Volume Hologram Laminate

A volume hologram laminate of the present invention preferably shows at least 2 minimal transparent wavelengths in the transmittance in visible light range. Thereby, the volume hologram laminate of the present invention becomes a laminate which can reproduce a further bright hologram image.

C. Volume Hologram Transfer Foil

Next, a volume hologram transfer foil of the present invention will be explained. As explained above, the volume hologram transfer foil of the present invention comprises the volume hologram laminate of the present invention, and a heat seal layer formed on the volume hologram-laminated part of the volume hologram laminate and comprising a thermoplastic resin.

Figure 7:
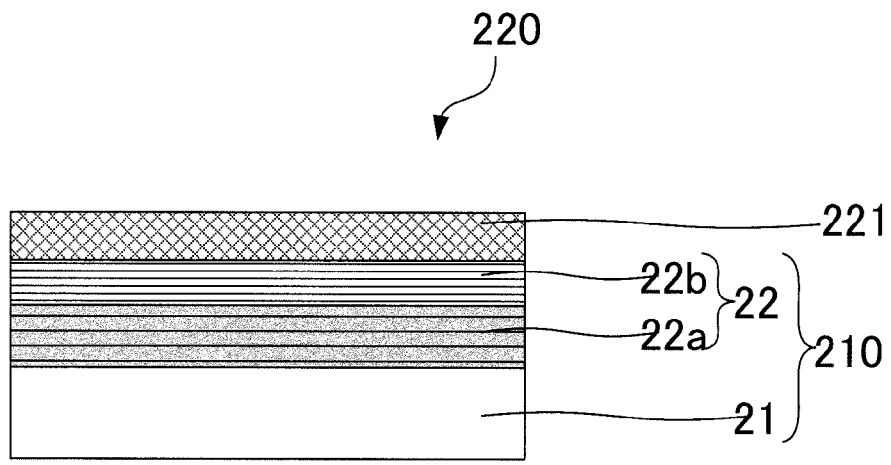
FIG. 7 is a schematic cross-section view illustrating one example of the volume hologram transfer foil of the present invention.

The volume hologram transfer foil of the present invention will be explained with reference to the drawings. FIG. 7 is a schematic cross-section view illustrating one example of the volume hologram transfer foil of the present invention. As shown in FIG. 7, a volume hologram transfer foil 220 of the present invention comprises: the above-mentioned volume hologram laminate 210, and a heat seal layer 221 formed on the volume hologram-laminated part 22 of the volume hologram laminate 210 and comprises a thermoplastic resin.

According to the present invention, because the volume hologram laminate is used, by arbitrary controlling the respective periods of interference fringes formed on the volume hologram layer and the resin layer of the volume hologram laminate, it is possible to obtain a volume hologram transfer foil to which the volume hologram that can regenerate the bright hologram image at an arbitrary wavelength can be transferred.

The volume hologram transfer foil of the present invention comprises at least the volume hologram laminate and the heat seal layer.

Hereinafter, the respective technical structure used in the volume hologram transfer foil will be explained in turn.

1. Volume Hologram Laminate

First, a volume hologram laminate used in the present invention will be explained. The volume hologram laminate used in the present invention relates to the above-mentioned embodiment. Thus, the volume hologram laminate used in the present invention is the same to the one explained in the above-mentioned section of "B. Volume Hologram Laminate".

Here, as explained above, the volume hologram laminate used in the present invention comprises at least the substrate and the volume hologram-laminated part. However, in view of that the volume hologram laminate of the present invention will be used in the volume hologram transfer foil, the volume hologram laminate of the present invention preferably has other technical structure than the above. As examples of the other technical structure for the volume hologram laminate, a releasing layer and a protection layer can be cited.

2. Heat Seal Layer

Next, a heat seal layer used in the present invention will be explained. The heat seal layer used in the present invention comprises a thermoplastic resin, and has a function to adhere the volume hologram-laminated part and a member to be transferred, at the time of transferring the volume hologram-laminated part to the member to be transferred using the volume hologram transfer foil of the present invention. Hereinafter, the heat seal layer used in the present invention will be explained in detail.

The thermoplastic resin used in the present invention is not particularly limited as long as it is a resin which can adhere the volume hologram-laminated part and a member to be transferred according to the kind of the member to which the volume hologram-laminated part is transferred from the volume hologram transfer foil of the present invention. As specific examples are identical to those to be explained later in the section of "E. Volume Hologram Laminate (Second Embodiment)", explanation here is omitted.

The thermoplastic resin used in the present invention may be a single kind or plural kinds.

The heat seal layer used in the present invention may further contain other additive(s) in addition to the thermoplastic resin. As the examples of other additive(s) used in the present invention, a dispersant, a filler, a plasticizer, and an antistat can be cited.

A thickness of the heat seal layer used in the present invention is not particularly limited and appropriately selected according to factors such as the kind of a member to be transferred, to which the volume hologram-laminated part is transferred using the volume hologram transfer foil of the present invention. In general, the thickness is preferably within the scope of 0.3 µm to 50 µm, and more preferably within the scope of 0.5 µm to 25 µm. When the thickness is thinner than the above-mentioned range, there is a possibility of the adhesion to the member to be transferred may become insufficient. When the thickness is thicker than the above-mentioned range, a temperature to heat the heat seal layer becomes too high at time of transferring the volume hologram-laminated part from the volume hologram transfer foil of the present invention and there is a possibility of damaging the other member such as the substrate.

Further, the heat seal layer used in the present invention may be a single layer or plural layers. An embodiment wherein plural heat seal layers are used in the present invention may be: an embodiment wherein heat seal layers of the same composition are laminated, or an embodiment wherein heat seal layers of different compositions are laminated.

3. Optional Technical Structure

The volume hologram transfer foil of the present invention comprises at least the volume hologram laminate and the heat seal layer, but may further comprise an optional technical structure as needed. As the optional technical structure used in the present invention, a structure having the desired function is appropriately selected according to an application of the volume hologram transfer foil of the present invention. In particular, as examples of the optional technical structure suitably used in the present invention, a separator, a printing layer (design layer) or a print layer (individual information numbering etc.) can be cited.

D. Volume Hologram Label

Next, a volume hologram label of the present invention will be explained. As explained above, the volume hologram label of the present invention comprises: the above-mentioned volume hologram laminate, and a binding layer formed on the volume hologram-laminated part of the volume hologram laminate.

Figure 8:
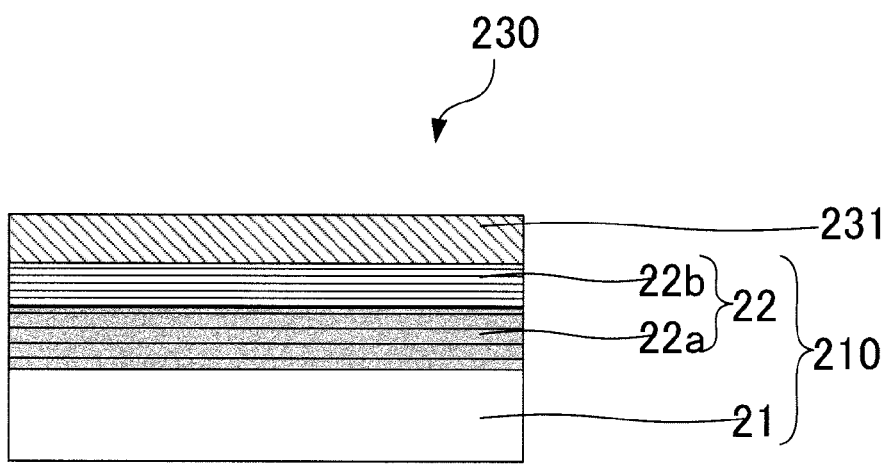
FIG. 8 is a cross-section view illustrating one example of the volume hologram label of the present invention.

Such volume hologram label of the present invention will be explained with reference to the drawings. FIG. 8 is a cross-section view illustrating one example of the volume hologram label of the present invention. As shown in FIG. 8, a volume hologram label 230 comprises: the above-mentioned volume hologram laminate 210, and a binding layer 231 formed on a volume hologram-laminated part 22 of the volume hologram laminate 210.

According to the present invention, because the volume hologram laminate of the present invention is used, by arbitrary controlling the respective periods of interference fringes formed on the volume hologram layer and the resin layer of the volume hologram laminate, it is possible to obtain a volume hologram label to which the volume hologram that can regenerate the bright hologram image at an arbitrary wavelength can be stuck.

The volume hologram label of the present invention comprises at least the volume hologram laminate and the binding layer, and may comprise other technical structure as needed. Hereinafter, the respective technical structure used for the volume hologram label of the present invention will be explained in turn.

1. Volume Hologram Laminate

First, a volume hologram laminate used in the present invention will be explained. The volume hologram laminate used in the present invention relates to the above-mentioned embodiment. Thus, the volume hologram laminate used in the present invention is the same to the one explained in the above-mentioned section of "B. Volume Hologram Laminate".

2. Adhesion Layer

Next, an adhesion layer used in the present invention will be explained. A binding agent constituting the adhesion layer used in the present invention may be a heat seal agent or a common pressure-sensitive binding agent. Here, as those to be explained later in the section of "E. Volume Hologram Laminate (Second Embodiment)" may be used as the adhesive agent for the present invention, explanation here is omitted.

A thickness of the binding layer is preferably within the range of 4 µm to 200 µm, and more preferably within the range of 5 µm to 100 µm.

E. Volume Hologram Laminate (Second Embodiment)

Next, the volume hologram laminate of the second embodiment of the present invention will be explained.

The volume hologram laminate of the present embodiment comprises: a resin layer partially provided on a substrate, and a volume hologram layer laminated on the substrate and formed so as to adjacent to the resin layer, characterized in that a volume hologram is formed on the resin layer, and characterized in that a part of the volume hologram laminate provided with the resin layer and a part of the volume hologram laminate provided with no resin layer have different regenerated-center wavelengths.

Figure 9A:
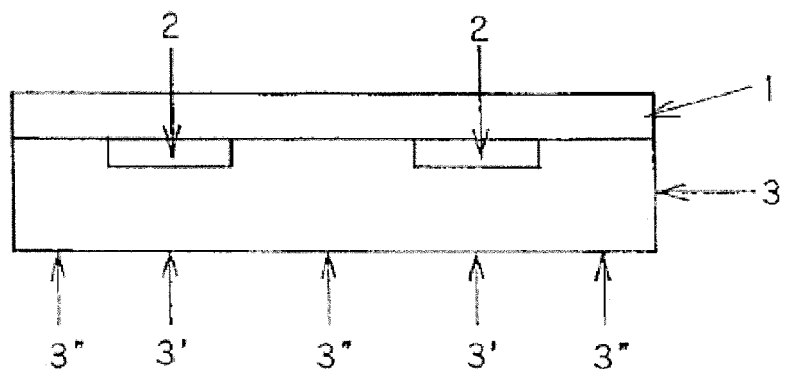
FIGS. 9A and 9B are each a cross-section view illustrating the volume hologram laminate (second embodiment) of the present invention.
Figure 9B:
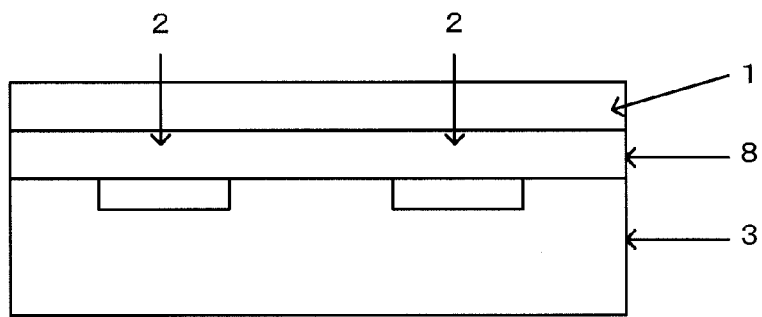

FIGS. 9A and 9B are each a cross-section view illustrating the volume hologram laminate of the present invention. The volume hologram laminate comprises: a resin layer 2 partially provided on a substrate 1, and a volume hologram layer 3, which comprises a volume hologram recording material that contains a radically polymerizable monomer and a cationic polymerizable monomer, and which is laminated on the substrate 1 and formed so as to adjacent to the resin layer 2 (FIG. 9A).

Here, in FIG. 9A, an embodiment wherein the substrate 1 and the resin layer 2 are formed so as to adjacent to each other, but the volume hologram laminate of the present invention is not limited to such embodiment. For example, the volume hologram laminate of the present invention may have an embodiment wherein a primer layer 8 is formed between the substrate 1 and the resin layer 2 (FIG. 9B).

The substrate 1 can use a substance such as polyethylene terephthalate which can support the resin layer 2 and the volume hologram layer 3. A thickness of the substrate is normally within the range of 2 μm to 200 μm, and preferably within the range of 10 μm to 50 μm.

Further, the substrate may be used as a protection film for the volume hologram sticker to be explained later, or may be peeled and removed. When the substrate is used as a protection film, adhesion between the substrate and the resin layer or the volume hologram recording material layer is necessary. Thus, it is better to conduct a surface treatment such as a corona treatment, an ozonation treatment, a plasma treatment, an ionization radiation treatment, a bichromatic treatment, an anchoring or primer treatment to the substrate surface. As the anchoring agent or the primer agent, an urethane-based, acrylic-based, ethylene-vinyl acetate copolymer-based, and chloroethene-vinyl acetate copolymer-based agents are cited. Further, when the substrate is peeled and removed, it is better to conduct a demold treatment and to provide the resin layer and the volume hologram layer with or with no protection layer in between.

Next, the resin layer 2 is a resin layer having transparency and is obtained by coating a resin solution on a part of the substrate such as on the pattern of logo. As examples of a resin forming the resin layer are identical to those explained in the above-mentioned section of "A. Producing Method of Volume Hologram Laminate", and polymethyl methacrylate (PMMA) resin is particularly cited here.

Although detailed reason is not clear, when the resin forming the resin layer is a resin such as a polymethyl methacrylate resin, a polyvinyl acetate resin, and a polyester resin, it was found possible to differentiate a regenerated-center wavelength of the part of the volume hologram laminate wherein the resin layer 2 is laminated (substrate 1/resin layer 2/volume hologram layer 3') to a long-wavelength side when compared to a regenerated-center wavelength of a part of the volume hologram laminate wherein the resin layer is not laminated (substrate/volume hologram layer 3"). The degree of differentiation depends on the size in the weight average molecular weight of the resin. To differentiate the regenerated-center wavelengths to longer-wavelength side, the weight average molecular weight is preferably 5,000 to 1,000,000, more preferably 5,000 to 500,000 and particularly preferably 10,000 to 300,000. The molecular weight of the resin denotes the weight average molecular weight obtained by polystyrene conversion measured by GPC (gel permeation chromatography).

The difference between the regenerated-center wavelength of the part of the volume hologram laminate provided with the resin layer and the regenerated-center wavelength of the part of the volume hologram laminate provided with no resin layer is at least 10 nm or more and is preferably 15 nm or more. The maximum difference is 100 nm.

Further, although detailed reason is not clear, when the resin forming the resin layer is a resin such as a polyvinyl butyral resin and a polyvinyl acetal resin, it was found possible, unlike the above case, to differentiate a regenerated-center wavelength of the part provided with the resin layer to a short-wavelength side when compared to a regenerated-center wavelength of a part provided with no resin layer. Similar to the above, however, the degree of differentiation depends on the size in the weight average molecular weight of the resin. To differentiate the regenerated-center wavelengths to shorter-wavelength side, the weight average molecular weight is preferably 5,000 to 1,000,000, more preferably 5,000 to 500,000 and particularly preferably 10,000 to 300,000.

The difference between the regenerated-center wavelength of the part of the volume hologram laminate provided with the resin layer and the regenerated-center wavelength of the part of the volume hologram laminate provided with no resin layer is at least 10 nm or more and is preferably 15 nm or more. The maximum difference is 100 nm.

Each of the regenerated-center wavelengths of the part provided with a resin layer and the part provided with no resin layer is obtained by measuring the transmission using a spectrophotometer (UV-2450™; manufactured by Shimadzu Corporation) to obtain the spectral transmission curve, and by calculating for the spectral transmission curve the regenerated-center wavelength with the diffraction efficiency and half bandwidth through the following method. It will be explained with reference to FIG. 4.

(Diffraction Efficiency)

The peak transmission A and base transmission B of the spectral transmission are obtained. The diffraction efficiency is obtained by the formula: $|B-A|/B$ (%).

(Half Bandwidth)

Left end (C) and right end (D) of a spectral transmission curve is obtained. The spectral transmission curve is a curb obtained at the transmission $(A+|B-A|/2)$, in which a half of the difference between the base transmission A and the peak transmission B is added to the peak transmission A. Thereby, the bandwidth is obtained by the formula: bandwidth=$|D-C|$ (nm).

(Regenerated-Center Wavelength)

The regenerated-center wavelength is a wavelength (=C+ $|D-C|/2$), in which a half of the half bandwidth is added to the C obtained through the calculation of the half bandwidth.

For the resin layer 2, an agent such as an antioxidant, a ultraviolet absorber, a light stabilizer, a thermal stabilizer, a plasticizer, a lubricant, an antistat, a flame retardant and a filler may be added to the extent that it does not affect the above-mentioned difference in the regenerated-center wavelength.

The resin layer 2 is formed by partially coating to the substrate a resin solution, in which a component such as the resin is dissolved to a substance such as methyl ethyl ketone, toluene, and acetic ether, by a printing method such as a gravure printing and a screen printing so as the dried layer thickness becomes 0.1 μm to 10 μm, preferably 0.5 μm to 5 μm and particularly preferably 0.5 μm to 3 μm.

The resin layer 2 may be formed so as to contact to the substrate 1, or may be formed so as to contact to the other layer such as a primer layer which is formed in such a manner so as to contact onto the substrate 1.

As the primer layer used in the present invention, a primer layer which has the desired function according to the application of the volume hologram laminate of the present invention can be appropriately selected and it is not particularly restricted.

As shown in FIGS. 9A and 9B, a volume hologram recording material layer is coated directly, without an intermediate layer, onto a resin layer 2 formed on a substrate 1.

The volume hologram recording material layer used in the present invention contains a photopolymerizable material, and from the view point to enabling the recording of a hologram image with high contrast, it is particularly preferable to combine the radically polymerizable compound and the cationic polymerizable compound. They are used together with a photo radical polymerization initiator and a photo cationic polymerization initiator.

Here, the radically polymerizable compound, photo radical polymerization initiator, cationic polymerizable compound, and photo cationic polymerization initiator used in the present invention are the same to those explained in the above-mentioned section of "A. Method of Producing Volume Hologram Laminate", and thus, their explanations are omitted here.

Next, method of producing a volume hologram laminate of the present invention will be explained.

The volume hologram laminate of present invention is produced by first partially coating on the substrate the resin layer, and then coating and forming on the substrate and the resin layer the volume hologram recording material layer, comprising a radically polymerizable monomer and a cationic polymerizable monomer, so as the material layer becomes adjacent to each of the substrate and the resin layer.

(1) An aging treatment is conducted to the obtained laminate.
  The aging treatment is conducted by leaving the laminate at room temperature or by heating the laminate at 40° C. to 80° C. for 1 hour to 48 hours. By this treatment, monomers and the like in the volume hologram recording material layer transit to the resin layer in the layer structure of substrate/resin layer/volume hologram recording material layer. As it will be explained later in Example 1, IR analysis of the aging treated-resin layer confirms that the radically polymerizable monomer and the cationic polymerizable monomer in the volume hologram recording material layer are transited to the resin layer.

(2) Then, after the aging treatment of the laminate, a hologram original master is adhered to the volume hologram recording material layer side and the resultant is laser irradiated from the substrate side of the laminate to conduct a hologram exposure. Thereby, a hologram-recorded volume hologram layer is obtained.
  The volume hologram is to record a hologram image by fixing the interference fringe generated by light interference to the volume hologram layer containing the photopolymerizable material as a fringe having different refractive indexes. Accordingly, as examples of the method of recording the volume hologram in the present process, the following methods can be cited: a method of injecting a reference light beam from the substrate side of the volume hologram forming substrate, injecting an object light beam from the volume hologram layer side and making these lights interfere in the volume hologram layer; and a method of providing a hologram original master on the volume hologram layer, and making the injected light and the reflected light reflected by the hologram original master interfere in the volume hologram layer by injecting the light from the substrate side. In particular, the method of using the above-mentioned hologram original master is preferable. Thereby, the volume hologram is recorded simply and easily.

(3) After the hologram exposure, the hologram original master is peeled and a PET film is laminated to the peeled surface. The laminate is heated at 50° C. to 150° C. for 5 minutes to 120 minutes and a UV was irradiated at 500 mJ/cm$^2$ to 5,000 mJ/cm$^2$. It is thought that the heating treatment diffuses again part of the polymerizable monomers, which are remained after the hologram exposure, and that the other monomers are fixed by the heating treatment-UV irradiation treatment so that a stable hologram is obtained.

In the present invention, when the resin layer is formed by using a polymethyl methacrylate resin or a polyvinyl acetate resin, it was found that the laminated part provided with a structure of the substrate/resin layer/volume hologram layer has the regenerated-center wavelength to the longer-wavelength side compare to the regenerated-center wavelength of the part of the volume hologram laminate provided with no resin layer. Although the detailed reason is not clear, from the electron microscope cross section photo taken in the Example 1 to be explained later, it is observed that the interference fringe period (interference fringe gap) of the volume hologram layer was enlarged from the interference fringe period (interference fringe gap) of the resin layer. Thus, it is thought that retransmit of monomers from the resin layer to the volume hologram layer is caused again by the above-mentioned (3) heating process, and thereby the regenerated-center wavelength of the substrate/resin layer/volume hologram layer laminated part is differentiate to the longer-wavelength side when compared to the regenerated-center wavelength of the substrate layer/volume hologram layer laminated part provided with no resin.

Further, when the resin layer is formed by a polyvinyl butyral resin or a polyvinyl acetal resin, it was found that at the laminated part of the substrate/resin layer/volume hologram layer of the volume hologram laminate, the regenerated-center wavelength thereof is differentiated to the shorter-wavelength side compare to the part provided with no resin layer of the volume hologram laminate. The detailed reason is not clear, but it is thought that, with polyvinyl butyral resin layer or polyvinyl acetal resin, monomers transit caused by the above-mentioned (3) heating process shows different transit from that of PMMA resin so that the regenerated-center wavelength of the substrate/resin layer/volume hologram layer laminated part is differentiated to the shorter-wavelength compare to the regenerated-center wavelength of the substrate/volume hologram layer laminated part provided with no resin layer.

As explained, the volume hologram laminate of the present invention can be made to the laminate partially having the part where the respective regenerated-center wavelengths are different. Further, even when a contact copy by a single wavelength laser is tried by making the obtained volume hologram laminate as an original master and adhering the volume hologram recording material layer thereto, parts where the respective regenerated-center wavelengths are different become dark so that the volume hologram is not easily copied. Thus, a volume hologram laminate can be made to the volume hologram laminate excellent in forgery prevention.

Figure 10:
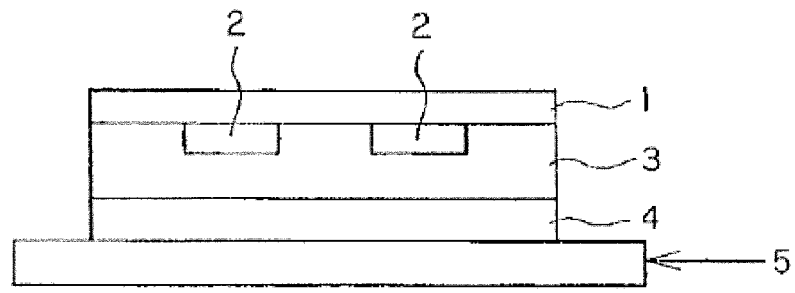
FIG. 10 is a cross-section view illustrating the first volume hologram transferring sheet of the present invention.

Next, the volume hologram transferring sheet of the present invention will be explained with reference to FIGS. 10 and 12. FIG. 10 illustrates a first volume hologram transferring sheet, wherein an adhesive layer 4 is provided on the volume hologram layer 3 of the volume hologram laminate of FIGS. 9A and 9B. The adhesive layer 4 is a pressure-sensitive adhesive layer or a heat seal layer. In particular, FIG. 10 illustrates the case of a volume hologram transfer label when the adhesive layer 4 is a pressure-sensitive adhesive layer and a peeling sheet 5 is further laminated. When the adhesive layer 4 is a heat seal layer, a peeling sheet 5 can be omitted and thereby a volume hologram transfer foil is obtained.

Figure 12:
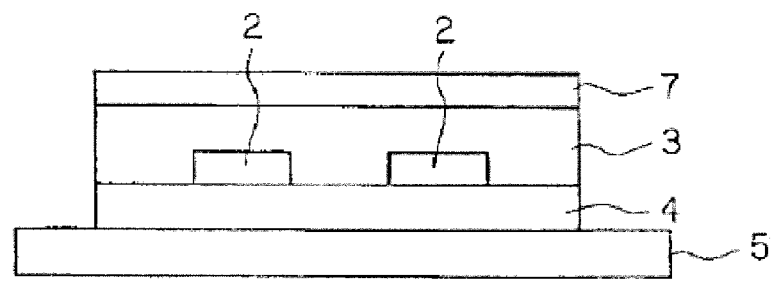
FIG. 12 is a cross-section view illustrating the second volume hologram transferring sheet of the present invention.

FIG. 12 illustrates a second volume hologram transferring sheet, wherein a second substrate 7 is provided to the volume hologram layer of the volume hologram laminate of FIGS. 9A and 9B in a peelable manner, and further, an adhesive layer 4 is provided on the resin layer 2 and the volume hologram layer 3 which are exposed by peeling the substrate 1 from the volume hologram laminate of FIGS. 9A and 9B. The adhesive layer 4 is a pressure-sensitive adhesive layer or a heat seal layer. In particular, FIG. 12 illustrates the case of a volume hologram transfer label when the adhesive layer 4 is a pressure-sensitive adhesive layer and a peeling sheet 5 is further laminated. When the adhesive layer 4 is a heat seal layer, a peeling sheet 5 can be omitted and thereby a volume hologram transfer foil is obtained.

As the binding agent of the volume hologram transfer label, an acrylate resin or the like can be used. The binding agent is preferably made into a coating solution by using a substance such as acetic ether, toluene, methyl ethyl ketone, or butyl acetate as a solvent, coated to a peeling sheet by a dried film thickness of 0.5 μm to 20 μm to form a pressure-sensitive adhesive layer, and then laminated to the volume hologram layer 3 together with the peeling sheet. As the peeling sheet, other than a common release coated paper, a film, obtained by conducting a release treatment to a film such as a polyethylene terephthalate resin film or a polypropylene resin film by a fluorine-based release agent or a silicone-based release agent, may be used.

As a heat seal agent of the volume hologram transfer foil, a thermoplastic resin having heat sealing properties, or a resin which can form a heat seal layer as an organic solvent solution are used. As examples of the resin which can form a heat seal layer as organic solvent solution, the following are cited: an ethylene-vinyl acetate copolymer resin, a polyamide resin, a polyester resin, a polyethylene resin, an ethylene-isobutylacrylate copolymer resin, a butyral resin, a polyvinyl acetate resin, chloroethene-vinyl acetate copolymer resin, cellulose derivatives, an acrylate resin such as a polymethyl methacrylate resin, a polyvinyl ether resin, a polyurethane resin, a polycarbonate resin, a polypropylene resin, an epoxy resin, a phenol resin, thermoplastic elastomer such as SBS, SIS, SEBS and SEPS, or a reactive hot-melt resin. As examples of an organic solution, toluene and methyl ethyl ketone are cited and they are preferably coated on the volume hologram layer 3 by dried film thickness of 2 μm to 10 μm with a comma coater, a dye coater, a gravure coater or the like.

Figure 11:
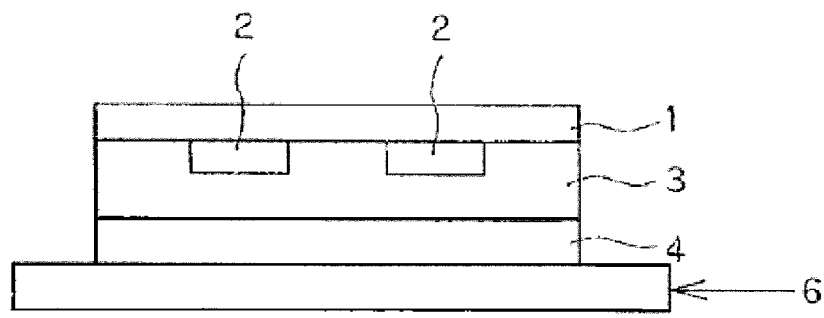
FIG. 11 is a cross-section view illustrating the volume hologram sticker produced by using the first volume hologram transferring sheet of the present invention.

The volume hologram sticker of the present invention will be explained with reference to FIGS. 11 and 13. As shown in FIG. 11, after peeling a peeling sheet 5 of the volume hologram transferring sheet shown in FIG. 10, the volume hologram sticker of the present invention is stuck to an adherend 6 from an adhesive layer 4 side of the volume hologram transferring sheet, and the substrate 1 is peeled and removed or remains to become a protection layer.

Figure 13:
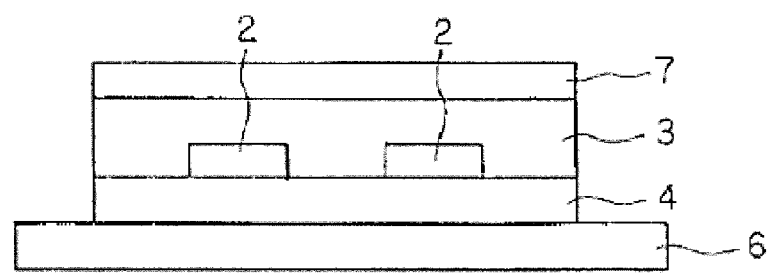
FIG. 13 is a cross-section view illustrating the volume hologram sticker produced by using the second volume hologram transferring sheet of the present invention.

Further, after peeling a peeling sheet 5 of the volume hologram transferring sheet shown in FIG. 12, the volume hologram sticker of FIG. 13 is stuck to an adherend 6 from an adhesive layer 4 side of the volume hologram transferring sheet, and a second substrate 7 is peeled and removed or remains to become a protection layer of the volume hologram layer.

As examples for the adherend 6 of the volume hologram sticker of the present invention, a transparent substance such as glass and plastic and an opaque substance can be cited. As examples of plastic, a chloroethene resin, an acrylate resin, a polystyrene resin, a polyester resin such as polyethylene terephthalate, or a polycarbonate resin are cited, and they are particularly suited for a card, sheet and film made of a polyester resin. The volume hologram transferring sheet may be stuck to an identification card, a sheet such as an examination admission card, a card such as an ID card, or a booklet such as a passport. Further, the sheet is suitably used as a certification which proves the classification in security or sanitarian such as fire control and sterilization, or alternatively suitably used for a certification proving that a proper procedure thereof is taken by a holder of the certification. In addition, for applications wherein paper certifications have been commonly used to seal and the subject product is a transparent and has flat or quadric surface, the sheet can be used instead. Moreover, as a subject to stick the volume hologram transferring sheet, a film and sheets made of papers, artificial papers, synthetic resins and metals or a product which has a part made of subject such as glass are widely used. Still further, by utilizing the unique properties and cube representation properties of the volume hologram, the sheet can also be used for books and magazines such as saddle-stitched weekly magazines, glass window of vehicles, and labels stuck for premium-version products.

The present invention is not limited to the above-mentioned embodiments. The embodiments are merely examples, and any one having the substantially same configuration as the technological idea disclosed in the claims of the present invention and the same effects is included in the technological scope of the present invention.

EXAMPLES

Hereinafter, the present invention will be specifically explained with reference to examples, but the embodiments of the present invention are not limited thereto.

1-1. Example 1

(1) Production of Volume Hologram Forming Substrate

As a substrate, a polyethylene terephthalate (PET) film (Lumirror 50T60™; manufactured by Toray Industries, Inc.) of 50 μm thickness was used. A resin layer forming-coating solution, in which polymethyl methacrylate having 15,000 weight average molecular weights were dissolved into a solvent, was coated by a bar coater to the substrate so as the coated thickness became 2 μm and then dried to form a resin layer.

Next, volume hologram layer forming-coating solution having the following composition was coated on the resin layer directly using an applicator so as a dried film thickness became 10 μm, and thereby a volume hologram layer was formed.

| (Volume Hologram Layer Forming-Coating Solution) | |
|---|---|
| polyvinyl acetate (Denka SAKNOHOL SN-08H ®: polymerization degree 800; manufactured by Denki Kagaku Kogyo Kabushiki Kaisha) | 35 weight parts |
| 1,6-hexanediol diglycidyl ether (Denacol EX-212 ®: manufactured by Nagase ChemteX Corporation) | 25 weight parts |
| bisphenoxyethanolfluorene diacrylate (BPEFA ®: manufactured by Osaka Gas Chemicals Co., Ltd.) | 35 weight parts |
| diaryliodonium salt (P12074 ®: manufactured by Rhodia) | 4 weight parts |
| 2,5-bis(4-diethylaminobenzylidene) cyclopentanone | 1 weight part |
| methyl isobutyl ketone | 100 weight parts |
| 1-butanol | 100 weight parts |

(2) Hologram Recording process

Next, a hologram original master was laminated on the volume hologram layer and a laser light of 532 nm was irradiated from the substrate side by 80 mJ/cm² to record a volume hologram. The hologram original master was peeled after the recording and a PET FILM of 50 μm thickness was laminated on the volume hologram layer.

(3) Substance Transit Process

Subsequently, the resin layer and the volume hologram layer were heated. Heating conditions at this time were 100° C. for 10 minutes.

(4) After-Treatment Process

Next, UV was irradiated to the entire surface to fix the volume hologram layer, and thereby a volume hologram laminate was obtained.

1-2. Example 2

A volume hologram laminate was produced in the same manner as in Example 1 except that polymethyl methacrylate of having 35,000 weight average molecular weights was used.

1-3. Example 3

A volume hologram laminate was produced in the same manner as in Example 1 except that polymethyl methacrylate of having 100,000 weight average molecular weights was used.

1-4. Example 4

A volume hologram laminate was produced in the same manner as in Example 1 except that a polyester resin having 40,000 weight average molecular weights (Vylon 270® manufactured by TOYOBO CO., LTD.) was used instead of polymethyl methacrylate.

1-5. Comparative Example 1

A volume hologram laminate was produced in the same manner as in Example 1 except that a resin layer was not formed and a volume hologram layer was directly formed on a substrate.

1-6. Evaluation of Hologram Recording Properties

The transmission of the each volume hologram laminates obtained in the Examples and the Comparative Example was measured using a spectrophotometer (UV-2450™; manufactures by Shimadzu Corporation), and the diffraction efficiency, half bandwidth, regenerated-center wavelength were measured from the spectral transmission curve. The results are shown in Table 1.

Figure 14:
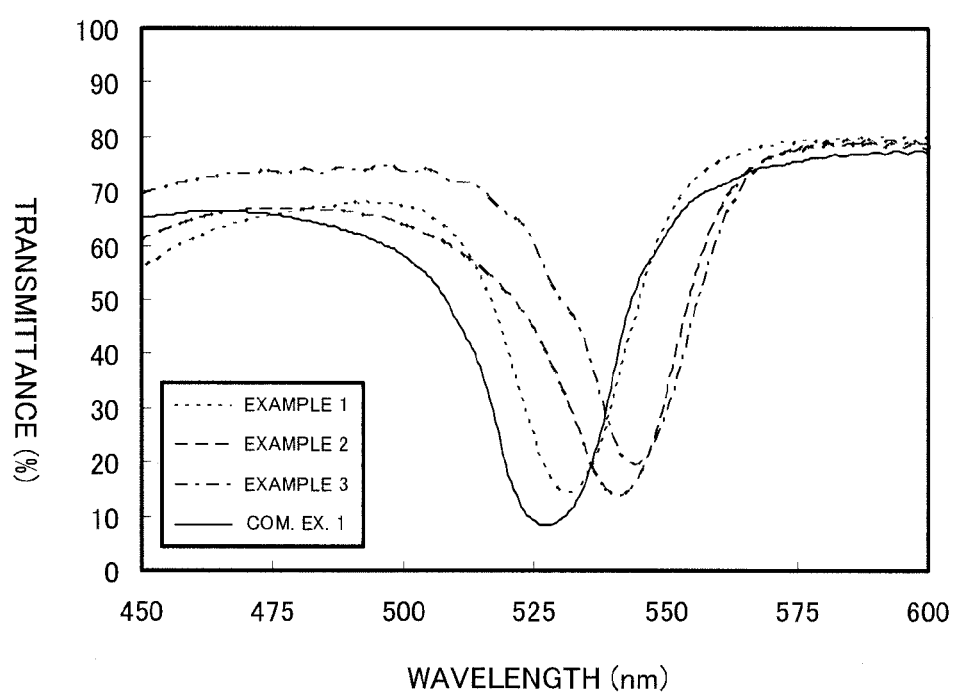
FIG. 14 is a graph showing the spectral transmission curves of the Examples and the Comparative Example.

Respective spectral transmission curves obtained in the Examples 1 to 3 and the Comparative Example 1 are shown in FIG. 14.

TABLE 1

|  | Half Bandwidth (nm) | Diffraction Efficiency (%) | Regenerated-Center Wavelength (nm) |
| --- | --- | --- | --- |
| Example 1 | 24 | 80 | 532 |
| Example 2 | 27 | 81 | 539 |
| Example 3 | 24 | 74 | 544 |
| Example 4 | 28 | 74 | 556 |
| Comparative Example 1 | 28 | 88 | 527 |

2-1. Example 5

(1) Production of Volume Hologram Forming Substrate

As a substrate, a polyethylene terephthalate (PET) film (Lumirror 50T60™; manufactured by Toray Industries, Inc.) of 50 μm thickness was used. A resin layer forming-coating solution, in which polymethyl methacrylate having 100,000 weight average molecular weights were dissolved into a methyl ethyl ketone solvent, was coated by a gravure printing method in pattern to the substrate so as the dried film thickness of the formed resin layer became 2 μm, and then dried to form a patterned resin layer.

Next, volume hologram layer forming-coating solution having the following composition was coated on the resin layer directly using an applicator so as a dried film thickness became 10 μm, and thereby a volume hologram layer was formed.

| (Volume Hologram Layer Forming-Coating Solution) | |
| --- | --- |
| polyvinyl acetate (Denka SAKNOHOL SN-08H ®: polymerization degree 800; manufactured by Denki Kagaku Kogyo Kabushiki Kaisha) | 35 weight parts |
| 1,6-hexanediol diglycidyl ether (Denacol EX-212 ®: manufactured by Nagase ChemteX Corporation) | 25 weight part |
| bisphenoxyethanolfluorene diacrylate (BPEFA ®: manufactured by Osaka Gas Chemicals Co., Ltd.) | 35 weight parts |
| diaryliodonium salt (P12074 ®: manufactured by Rhodia) | 4 weight parts |
| 2,5-bis(4-diethylaminobenzylidene) cyclopentanone | 1 weight part |
| methyl isobutyl ketone | 100 weight parts |
| 1-butanol | 100 weight parts |

(2) Aging Process

The obtained volume hologram laminate was left at room temperature for 24 hours and an aging treatment was conducted. After the aging treatment, the resin layer was analyzed by an IR analyzing device (FT/IR-610 manufactured by JASCO Corporation) and it was confirmed that 1,6-hexanediol diglycidyl ether and bisphenoxyethanolfluorene diacrylate were contained.

(3) Hologram Recording Process

A hologram original master was laminated on the volume hologram layer of the volume hologram laminate and a laser light of 532 nm was irradiated from the substrate side by 80 mJ/cm$^2$ to record a volume hologram. The hologram original master was peeled after the recording and a PET film of 50 μm thickness was laminated on the volume hologram layer.

(4) Heating Treatment-UV Irradiation Treatment Process

The volume hologram laminate with the hologram recorded was heating treated at 100° C. for 10 minutes. UV (3,000 mJ/cm$^2$) was then irradiated thereto entirely to fix the hologram, and thereby a volume hologram laminate was obtained.

Figure 15:
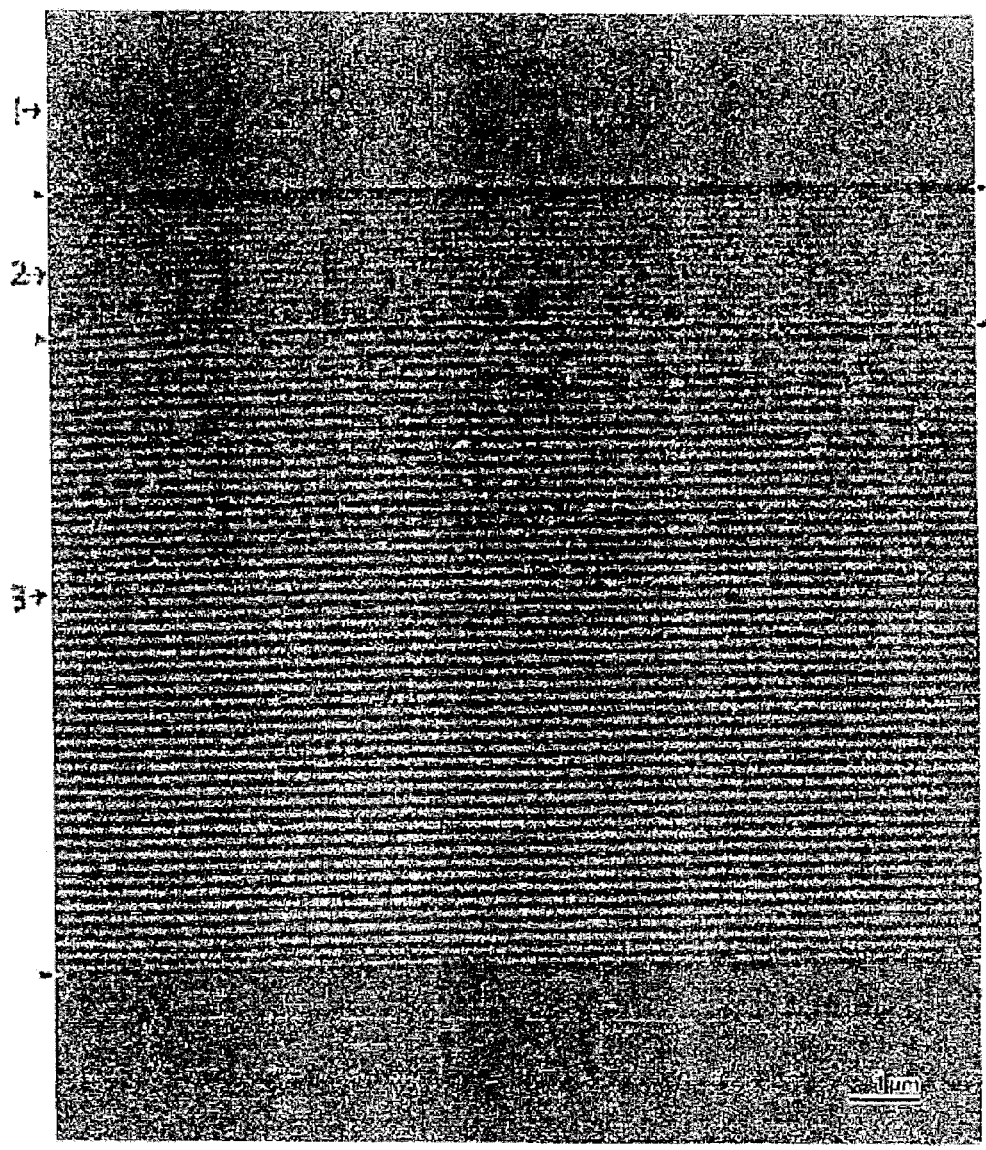
FIG. 15 is a 70%-zoomed copy of scanning electron micrograph (15,000 times) of the cross section in the resin layer laminated part of the volume hologram laminate of the present invention (second embodiment).

FIG. 15 is a 70%-zoomed copy of scanning electron micrograph (15,000 times) of the vertical cross section in the resin layer laminated part of the volume hologram laminate obtained. The references made in FIG. 15 are as follows: 1 is a substrate, 2 is a resin layer and 3 is a volume hologram layer. It can be observed that interference fringes are recorded in the resin layer 2 by the gap of 116 nm and interference fringes are recorded in the volume hologram layer 3 by the gap of 186 nm.

Figure 16:
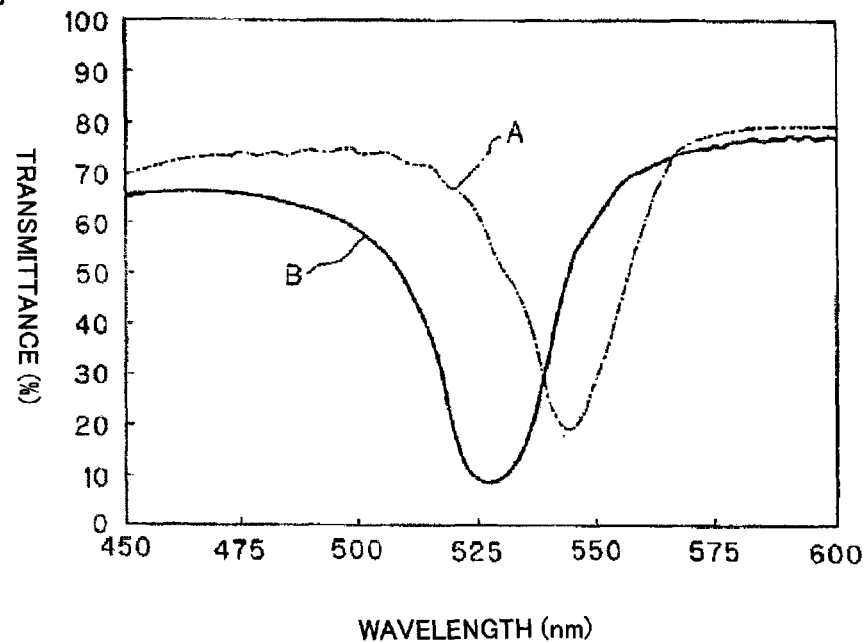
FIG. 16 illustrates the spectral transmission curves of the part with the resin layer patterned and the part with no resin layer patterned of the volume hologram laminate of the present invention (second embodiment).

Results of measuring the transmissions of the part where the resin layer is patterned and the part where the resin layer is not patterned, by a spectrophotometer (UV-2450™; manufacture by Shimadzu Corporation) are shown in FIG. 16 as the spectral transmission curves.

The regenerated-center wavelength of the spectral transmission curve (A) of the part where the resin layer is patterned was 544 nm and the regenerated-center wavelength of the spectral transmission curve (B) the part where the resin layer is not patterned was 527 nm.

(Forgery Prevention Properties)

The above-mentioned volume hologram layer forming-coating solution was coated on a PET film of 50 μm thickness using an applicator so as the dried film thickness became 10 μm, and thereby a laminate was obtained. The above-mentioned volume hologram laminate with the volume hologram recorded was stuck as an original master to the PET film from the volume hologram recording material layer side of the laminate. The volume hologram was subsequently photographed using a laser light of 532 nm. The obtained photograph showed that the patterned resin layer was dark and the hologram was not well photographed.

2-2. Example 6

A volume hologram laminate with the volume hologram recorded was obtained in the same manner as in Example 5 except that a methyl ethyl ketone solution of a polyvinyl acetal resin (S-LEC BH-6®: about 92,000 weight average molecular weights: manufactured by SEKISUI CHEMICAL CO., LTD.) was used as a coating solution for a resin layer.

Figure 17:
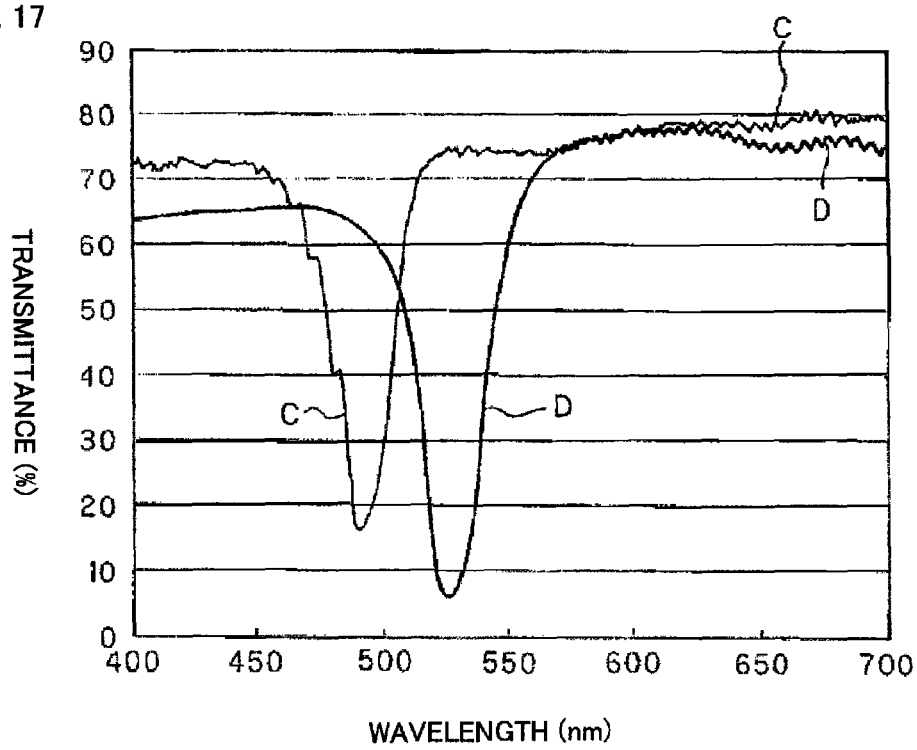
FIG. 17 illustrates the spectral transmission curves of the part with the resin layer patterned and the part with no resin layer patterned of the volume hologram laminate of the present invention (second embodiment).

The transmissions of the part where the resin layer is patterned and the part where the resin layer is not patterned are measured by using a spectrophotometer (UV-2450™; manufactured by Shimadzu Corporation). FIG. 17 shows the obtained spectral transmission curves.

The regenerated-center wavelength of the spectral transmission curve (C) of the part where the resin layer is patterned was 490 nm and the regenerated-center wavelength of the spectral transmission curve (D) the part where the resin layer is not patterned was 527 nm.

Further, in the same manner as in Example 5, to check the forgery prevention properties, the obtained volume hologram was photographed using the above-mentioned volume hologram laminate with the volume hologram recorded as an original master. The obtained photograph showed that the patterned resin layer was dark and the hologram was not well photographed.

2-3. Example 7

A volume hologram laminate with the volume hologram recorded was obtained in the same manner as in Example 5 except that a methyl ethyl ketone solution of a polyvinyl acetate resin (about 500,000 weight average molecular weights: manufactured by SIGMA-ALDRICH Corp.) was used as a coating solution for a resin layer.

The transmissions of the part where the resin layer is patterned and the part where the resin layer is not patterned were measured using a spectrophotometer (UV-2450™; manufactured by Shimadzu Corporation). The regenerated-center wavelength of the part where the resin layer is patterned was 554 nm and the regenerated-center wavelength of the part where the resin layer is not patterned was 527 nm.

Further, in the same manner as in Example 5, to check the forgery prevention properties, the obtained volume hologram was photographed using the above-mentioned volume hologram laminate with the volume hologram recorded as an original master. The obtained photograph showed that the patterned resin layer was dark and the hologram was not well photographed.

2-4. Example 8

A volume hologram laminate with the volume hologram recorded was obtained in the same manner as in Example 5 except that a methyl ethyl ketone solution of a polyester resin (Vylon 270®: weight average molecular weight 40,000; manufactured by TOYOBO CO., LTD.) was used as a coating solution for a resin layer.

The transmissions of the part where the resin layer is patterned and the part where the resin layer is not patterned were measured using a spectrophotometer (UV-2450™; manufactured by Shimadzu Corporation). The regenerated-center wavelength of the part where the resin layer is patterned was 556 nm and the regenerated-center wavelength of the part where the resin layer is not patterned was 527 nm.

Further, in the same manner as in Example 5, to check the forgery prevention properties, the obtained volume hologram was photographed using the above-mentioned volume hologram laminate with the volume hologram recorded as an original master. The obtained photograph showed that the patterned resin layer was dark and the hologram was not well photographed.

2-5. Example 9

A binding agent solution of the following components was coated by an applicator to the volume hologram layer of the volume hologram laminate produced in Example 5 so as the dried film thickness became 20 μm, the resultant was dried in an oven, and thereby a pressure-sensitive adhesive layer was formed.

| | |
|---|---|
| acrylic-based binding agent (Nissetsu PE-118 ®; manufactured by NIPPON CARBIDE INDUSTRIES CO., INC.) | 100 mass parts |
| isocyanate-based cross-linking agent (Nissetsu CK-101 ®; manufactured by NIPPON CARBIDE INDUSTRIES CO., INC.) | 2 mass parts |
| solvent (methyl ethyl ketone/toluene/acetic ether = 2/1/1 (mass ratio) | 60 mass parts |

Then, a peeling sheet (SPEET® (75 μm); manufactured by TOHCELLO CO., LTD.) was laminated on the pressure-sensitive adhesive layer, and thereby a volume hologram transferring sheet which is the first volume hologram transferring sheet of the present invention was obtained.

After the peeling sheet was peeled from the volume hologram transferring sheet, it was stuck by a hand laminator to a PVC card, which is an adherend, from the pressure-sensitive adhesive layer side, and thereby a volume hologram sticker of the present invention was obtained. The sticker, which has different regenerated-center wavelengths in pattern form between the part provided with the resin layer and the part provided with no resin layer of the volume hologram, and is excellent in design was obtained.

2-6. Example 10

A peelable over protection layer faulting-coating solution having the following composition was coated on an untreated-PET film (Lumirror T60™ (25 μm); manufactured by Toray Industries, Inc.) by a bar coater so as the dried film thickness became 1 μm, dried in an oven, and thereby a laminate of PET film/peelable over protection layer was obtained.

| | |
|---|---|
| polymethyl methacrylate (weight average molecular weight 100,000) | 97 mass parts |
| polyethylene wax (weight average molecular weight 10,000) | 3 mass parts |
| solvent (methyl ethyl ketone/toluene/acetic ether = 2/1/1 (mass ratio) | 60 mass parts |

The volume hologram laminate (PET film/resin layer/volume hologram layer/PET film) obtained in the producing method of the volume hologram laminate explained in Example 5 and before the process of (4) Heating Treatment-UV Irradiation Treatment was used. A PET film of the volume hologram layer side was peeled, the laminate was set into a roller of 80° C. in a manner such that the volume hologram layer side thereof faced to the peelable over protection layer surface of the laminate of PET film/peelable over protection layer obtained above, and the laminates were pressed in the roller. Afterwards, UV was irradiated to the entire surface and a volume hologram laminate of PET film/peelable over protection layer/volume hologram layer/resin layer/PET film was obtained.

A PET film of the resin layer side of the obtained volume hologram laminate was peeled and a heat seal layer forming-coating solution of the following composition was coated by a bar coater on the volume hologram layer and the partially-provided resin layer so as the dried film thickness became 4 μm.

| | |
|---|---|
| polyester resin (Vylonal MD1985 ®; manufactured by TOYOBO CO., LTD.) | 100 mass parts |
| solvent (water/isopropyl alcohol = 1/1 (mass ratio)) | 100 mass parts |

The resultant was dried in an oven, and thereby, a volume hologram transfer foil of the second volume hologram transferring sheet of the present invention having PET film/peelable over protection layer/volume hologram layer/resin layer/heat seal layer was obtained.

The obtained volume hologram transfer foil was covered on a PVC card, which is an adherend, from the heat seal layer side using a hot stamper (V-08®; manufactured by Navitas Co., Ltd.) under conditions of transfer temperature 150° C., transfer time 0.5 second and pressing-pressure 125 kgf/cm². Then the PET film was peeled and a volume hologram sticker of peelable over protection layer/volume hologram layer/resin layer/heat seal layer/PVC card was obtained. The sticker, which has different regenerated-center wavelengths in pattern form between the part provided with the resin layer and the part provided with no resin layer of the volume hologram, and is excellent in design was obtained.

The invention claimed is:

1. A method of producing a volume hologram laminate using a volume hologram forming substrate which comprises:
    a substrate,
    a volume hologram layer formed on the substrate and containing a photopolymerizable material,
    a resin layer, formed on the substrate so as to contact to the volume hologram layer, containing a resin selected from the group consisting of a polymethyl methacrylate resin, a polyvinyl acetate resin, and a polyester resin, wherein the producing method comprises processes of:
    a pre-treatment process of transiting a polymerizable compound contained in the volume hologram layer to the resin layer by heating for 1 to 48 hours,
    a hologram recording process to record a volume hologram to the volume hologram layer,
    a substance transit process of transiting the polymerizable compound transited to the resin layer from the volume hologram layer by heating for 5 to 120 minutes, and
    followed by an after-treatment process of polymerizing the polymerizable compound by exposing to ultraviolet.

2. The method of producing a volume hologram laminate according to claim 1, wherein the photopolymerizable material contains a radically polymerizable compound and a cationic polymerizable compound, and wherein the polymerizable compound is the cationic polymerizable compound.

3. A method of producing a volume hologram laminate, wherein the following processes are sequentially carried out to a laminate obtained by partially coating and forming on a portion of a substrate a resin layer consisting of a resin selected from the group consisting of polymethyl methacrylate resin, a polyvinyl acetate resin, and a polyester resin and then overcoating the substrate and contacting the resin layer with a volume hologram recording material layer comprising a radically polymerizable monomer and a cationic polymerizable monomer;
    (1) a process of conducting an aging treatment to the laminate and transiting the polymerizable monomer of the volume hologram recording material layer to the resin layer by heating for 1 to 48 hours,
    (2) a hologram exposing process of exposing the laminate with laser from the substrate side, and
    (3) a hologram fixing process of conducting a heating treatment for 5 to 120 minutes and followed by an ultraviolet exposure treatment to move the polymerizable monomer from the resin layer to the volume hologram recording material layer and fixing a hologram;
        wherein a volume hologram based on the polymerizable monomer transited from the adjacent volume hologram recording material layer is formed on the resin layer; and further
        wherein a regenerated-center wavelength of a part of the laminate provided with the resin layer is differentiated to a long-wavelength side when compared to a regenerated-center wavelength of a part of the laminate provided with no resin layer.

4. A method of producing a volume hologram laminate, wherein the following processes are sequentially carried out to a laminate obtained by partially coating and forming on a portion of a substrate a resin layer consisting of a resin selected from the group consisting of a polyvinyl butyral resin and a polyvinyl acetal resin and then overcoating the substrate and contacting the resin layer with a volume hologram recording material layer comprising a radically polymerizable monomer and a cationic polymerizable monomer;
    (1) a process of conducting an aging treatment to the laminate and transiting the polymerizable monomer of the volume hologram recording material layer to the resin layer by heating for 1 to 48 hours,
    (2) a hologram exposing process of exposing the laminate with laser from the substrate side, and
    (3) a hologram fixing process of conducting a heating treatment for 5 to 120 minutes and followed by an ultraviolet exposure treatment to move the polymerizable monomer from the volume hologram recording material layer to the resin layer and fixing a hologram;

wherein a volume hologram based on the polymerizable monomer transited from the adjacent volume hologram recording material layer is formed on the resin layer; and further wherein a regenerated-center wavelength of a part of the laminate provided with the resin layer is differentiated to a short-wavelength side when compared to a regenerated-center wavelength of a part of the laminate provided with no resin layer.

* * * * *